(12) United States Patent
Matsuoka et al.

(10) Patent No.: US 8,972,911 B2
(45) Date of Patent: Mar. 3, 2015

(54) IMAGE PROCESSING DEVICE AND COMPUTER PROGRAM FOR PERFORMING IMAGE PROCESSING

(75) Inventors: Ryoichi Matsuoka, Yotsukaido (JP); Hiroaki Mito, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/000,212

(22) PCT Filed: Feb. 27, 2012

(86) PCT No.: PCT/JP2012/054726
§ 371 (c)(1),
(2), (4) Date: Aug. 17, 2013

(87) PCT Pub. No.: WO2012/117997
PCT Pub. Date: Sep. 7, 2012

(65) Prior Publication Data
US 2013/0326439 A1 Dec. 5, 2013

(30) Foreign Application Priority Data

Feb. 28, 2011 (JP) ................................. 2011-041109

(51) Int. Cl.
*G06F 17/50* (2006.01)
*G01B 15/04* (2006.01)
*H01L 21/66* (2006.01)
*G03F 7/20* (2006.01)

(52) U.S. Cl.
CPC ............... *G06F 17/50* (2013.01); *G01B 15/04* (2013.01); *H01L 22/12* (2013.01); *G03F 7/70625* (2013.01)
USPC .......................................................... 716/55

(58) Field of Classification Search
CPC ............................ G06F 17/50–17/5081; G03F 7/70616–7/70683
See application file for complete search history.

(56) References Cited

U.S. PATENT DOCUMENTS

| | | | |
|---|---|---|---|
| 6,777,147 B1 * | 8/2004 | Fonseca et al. | 430/30 |
| 6,782,525 B2 * | 8/2004 | Garza et al. | 716/52 |
| 6,909,930 B2 * | 6/2005 | Shishido et al. | 700/121 |
| 6,976,240 B2 * | 12/2005 | Chang | 716/52 |
| 7,235,782 B2 | 6/2007 | Takane et al. | |
| 7,457,736 B2 | 11/2008 | Chang | |
| 7,507,961 B2 * | 3/2009 | Toyoda et al. | 250/310 |

(Continued)

FOREIGN PATENT DOCUMENTS

| | | | |
|---|---|---|---|
| JP | 2000-236007 A | 8/2000 | |
| JP | 2002-328015 A | 11/2002 | |

*Primary Examiner* — Leigh Garbowski
(74) *Attorney, Agent, or Firm* — Miles & Stockbridge P.C.

(57) ABSTRACT

It is an object of the present invention to provide an image processing device for allowing an actual-image-closer pattern to be formed based on the design data, or its simulation image. In order to accomplish the above-described object, the proposal is made concerning an image processing device which includes an image processing unit which sets the operation condition of a charged-particle beam device on the basis of the design data on a semiconductor element. Here, the image processing device accesses a library for storing device-condition information on the charged-particle beam device, pattern types, and a plurality of combinations of pattern information on each pattern-region basis. Moreover, the image processing device forms a composite image of each pattern region, using the pattern information on each pattern-region basis, and based on the device-condition information and the selection of a pattern type from the pattern types.

15 Claims, 16 Drawing Sheets

(56) References Cited

U.S. PATENT DOCUMENTS

| | | | |
|---|---|---|---|
| 7,559,047 B2 * | 7/2009 | Miyamoto et al. | 716/50 |
| 7,729,529 B2 * | 6/2010 | Wu et al. | 382/149 |
| 8,364,452 B2 * | 1/2013 | Mitsuhashi | 703/6 |
| 2005/0278670 A1 * | 12/2005 | Brooks et al. | 716/5 |
| 2008/0138916 A1 * | 6/2008 | Mitsui | 438/16 |
| 2013/0132913 A1 * | 5/2013 | Fu et al. | 716/51 |

* cited by examiner

FIG.5

| Pattern | Process condition | | SEM condition | Registered image data |
|---|---|---|---|---|
| | Focus | Dose | | |
| Line 1 | | | | |
| Line 2 | | | | |
| Line 3 | | | | |
| ⋮ | | | | |
| Corner (outer) | | | | |
| outer 1 | | | | |
| outer 2 | | | | |
| outer 3 | | | | |
| ⋮ | | | | |
| Corner (inner) | | | | |
| inner 1 | | | | |
| inner 2 | | | | |
| inner 3 | | | | |
| ⋮ | | | | |

FIG.6

| Pattern | Process condition | | SEM condition | brightness | distribution (approximate function) | gray level 1 (background) | gray level 2 (pattern) |
|---|---|---|---|---|---|---|---|
| | Focus | Dose | | | | | |
| Line 1 | | | | | | | |
| Line 2 | | | | | | | |
| Line 3 | | | | | | | |
| ... | | | | | | | |
| Corner (outer) | | | | | | | |
| outer 1 | | | | | | | |
| outer 2 | | | | | | | |
| outer 3 | | | | | | | |
| ... | | | | | | | |
| Corner (inner) | | | | | | | |
| inner 1 | | | | | | | |
| inner 2 | | | | | | | |
| inner 3 | | | | | | | |
| ... | | | | | | | |

IMAGE PROCESSING DEVICE AND COMPUTER PROGRAM FOR PERFORMING IMAGE PROCESSING

TECHNICAL FIELD

The present invention relates to an image processing device and charged-particle beam device for performing the dimension measurement and inspection of a pattern formed on a sample. More specifically, it relates to an image processing device and computer program for allowing setting of the measurement and inspection condition for a measurement device or inspection device.

BACKGROUND ART

In a device for measuring and inspecting a pattern formed on a semiconductor wafer, the template-matching technology is used in order to focus the microscope's field-of-view (: FOV) onto a desired measurement position. The template-matching technology is an image processing technology for finding out from inside a to-be-searched image, an area that coincides most with a template image registered in advance. The template-matching technology is known as a technique that is effective for searching for a microminiaturized pattern. The template-matching-used template image needs to be prepared in advance. In PATENT LITERATURES 1 and 2, the explanation has been given concerning a technique for creating the template image like this from the simulation image of design data (i.e., pattern's layout data). The layout data is data for indicating a pattern's ideal shape. Accordingly, there exists a gap in shape or the like between the layout data and a pattern that is actually formed via the semiconductor fabrication processes. As a result, in some cases, it becomes difficult to make the coincidence-degree judgment with a high accuracy. In PATENT LITERATURES 1 and 2, however, the template image is formed based on the simulation-applied design data. This condition makes it possible to suppress the shape difference between the template image and the target pattern on the to-be-searched image. As a consequence of this suppression, it becomes possible to enhance a success ratio of the matching.

Meanwhile, as disclosed in PATENT LITERATURE 3, dm explanation has been given regarding a technique for suppressing the shape difference between the layout data and the to-be-searched image by applying a smoothing processing to each of the layout data and the to-be-searched image.

CITATION LIST

Patent Literature

PATENT LITERATURE 1: JP-A-2000-236007
PATENT LITERATURE 2: U.S. Pat. No. 7,457,736
PATENT LITERATURE 3: JF-A-2002-328015 (corresponding U.S. Pat. No. 7,235,782)

SUMMARY OF INVENTION

Technical Problem

A pattern, which is actually formed via the semiconductor fabrication processes, is equipped with an expanse at the pattern's edge portion. Namely, the pattern is formed with a certain extent of width. A charged-particle beam device such as a scanning electron microscope (: SEM) is a device for forming an image by detecting secondary electrons or the like which are obtained based on a beam scanning onto the sample. Here, a sample's portion that is equipped with an inclined plane inclined to an incident direction of the beam generates larger number of secondary electrons as compared with a sample's portion that is equipped with a perpendicular plane perpendicular to the incident direction of the beam. As a result, the luminance of the inclined-plane-equipped portion becomes relatively higher. The layout data exhibits only a two-dimensionally graphics shape. Meanwhile, the pattern that is actually formed via the semiconductor fabrication processes is equipped with a certain extern of height. Moreover, the pattern's edge portion is inclined. These conditions bring about the edge effect, thereby causing the edge to be represented in accompaniment with the expanse that is not found in the layout data.

The template-image creation method disclosed in PATENT LITERATURES 1 and 2 finds it impossible to sufficiently represent the portion that is strongly influenced by the edge effect like this, and image information that is characteristic of the SEM image. Accordingly there exists a limit to the high-accuracy implementation of the template matching. Also, the image processing method disclosed in PATENT LITERATURE 3 finds it possible to reduce to some extent the difference between, the layout data and the to-be-searched image. The SEM-image-related information, however, is not included in the layout data all the same. Consequently, there also exists a limit to the high-accuracy implementation of the template matching.

Hereinafter, the explanation will be given below concerning an image processing device and computer program whose object is as follows: Namely, the pattern that is close to an actual image is formed based on the design data, or its simulation image.

Solution to Problem

As one aspect for accomplishing the above-described object, the proposal is made concerning the following image processing device or computer program: Namely, an image processing device including an image processing unit for setting the operation condition of a charged-particle beam device on the basis of design data on a semiconductor element, or a computer program for causing a computer to execute the image processing, wherein the image processing unit includes a composite-image formation unit, the composite-image formation unit being so configured as to be able to access a library, the library being used for storing device-condition information on the charged-particle beam device, pattern types, and a plurality of combinations of plural pieces of pattern information on each pattern-region basis, and the composite-image formation unit forming a composite image of each pattern region, using the pattern information on each pattern-region basis, and based on the device-condition information and the selection of a pattern type from the pattern types.

Advantageous Effects of Invention

According to the above-described one aspect, it becomes possible to form the image that is approximate to an image acquired by the charged-particle beam device, before this image acquisition by the charged-particle beam device is performed. The employment of the configuration like this makes it possible to easily implement, for example, the creation of the template-matching-used template, and the creation of a template's verification-dedicated reference image without causing the charged-particle beam device to operate.

The other objects, features and advantages of the present invention will become apparent from the following description of embodiments of the present invention associated with the accompanying drawings.

BRIEF DESCRIPTION OF DRAWINGS

FIG. 5 is a diagram for illustrating an example of the library where pattern types, device conditions for a scanning electron microscope, and the registered images are stored in a manner of being made related with each other;

FIG. 6 is a diagram for illustrating an example of the library where the pattern types, the device conditions for the scanning electron microscope, and edge adjustment information are stored in a manner of being made related with each other;

DESCRIPTION OF EMBODIMENTS

Figure 1:
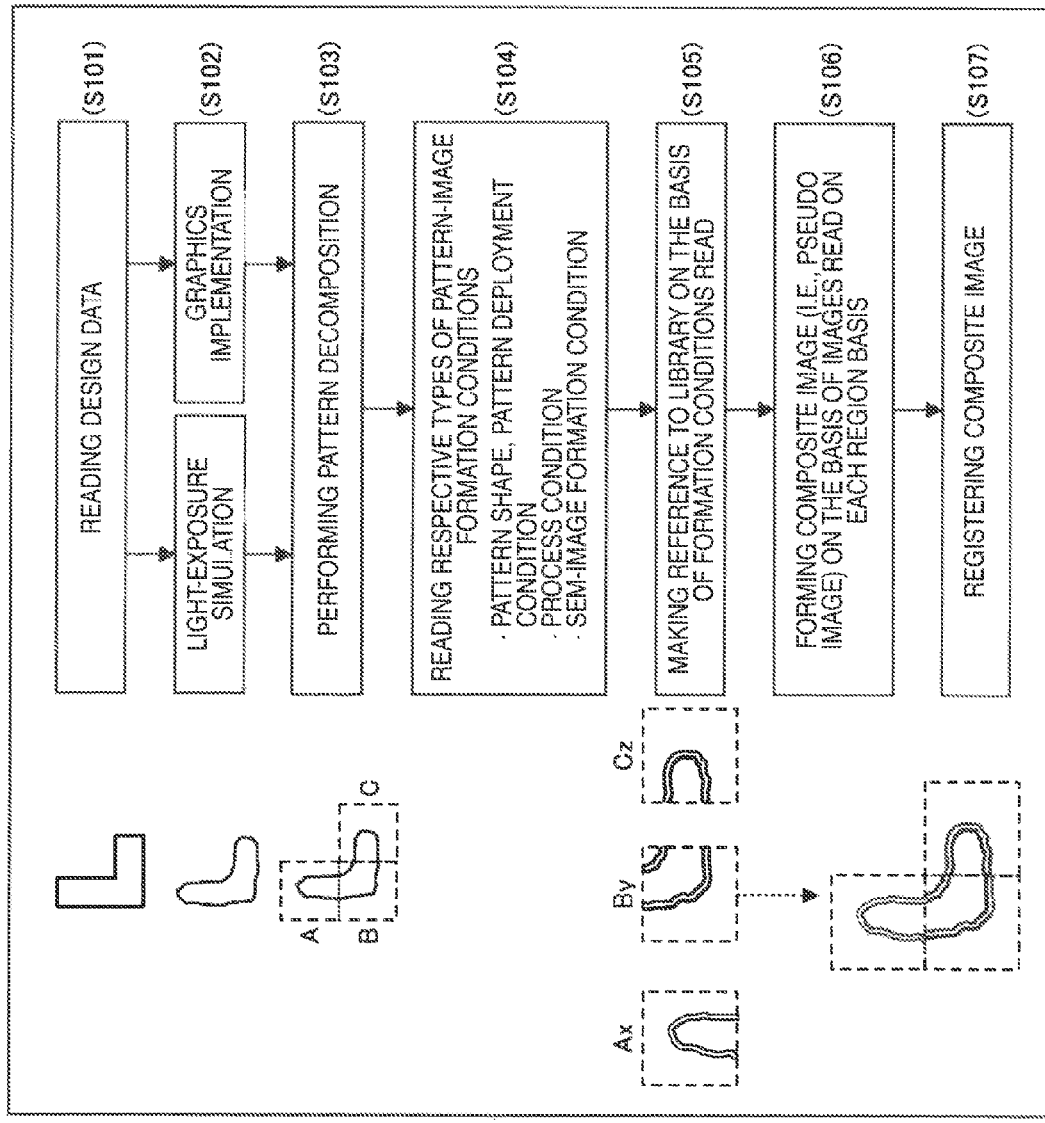
FIG. 1 is a flowchart for illustrating steps through which a composite image (i.e., pseudo image) is formed based on the reference made to the library.

Embodiments that will be explained hereinafter relate to a device for performing the creation of a measurement recipe, or the verification and correction of validity of the measurement recipe, a computer program for causing a computer to execute these processings, and a storage medium from which the computer program is readable. Here, the measurement recipe is used when measuring semiconductor-light-exposure-used mask shape, and silicon shape, i.e., exposed semiconductor-transferred pattern, in the semiconductor fabrication processes. In other words, the above-described embodiments are designed for enhancing the production efficiency in foe semiconductor fabrication processes.

On account of the development of microminiaturization technology in the semiconductor-device fabrication, there has occurred a remarkable microminiaturization of a fabricated pattern. This situation has made it necessary to execute the high-magnification measurement in inspection/measurement in the semiconductor-device production.

As a result of this high-magnification measurement, the clarity becomes unstable which is of the SEM image's white bands of the mask shape and semiconductor-transferred pattern to be photographed. This instability has made it more and more difficult to photograph the image at a desired position and to make the edge detection. As a consequence, this situation becomes a factor for causing a failure to occur in the measurement-recipe-used automated measurement, thereby resulting in a lowering in the production efficiency.

Meanwhile, the number of the recipes to be used for the automated measurement increases in accompaniment with an increase in the number of in-production product species due to the semiconductor's diversity. This increase in the recipe number has become a recipe's-operational-cost-increasing problem, i.e., the operational cost of the measurement-used recipes is increasing.

Also, in trying to make the tender progress in the microminiaturization, the limit of the wavelength of a light-source used m the light-exposure technology makes absolutely necessary the high-accuracy implementation of the OPC (: Optical Proximity Correction) which is based on the super-resolution technology (i.e., RET). Namely, the request for this OPC's high-accuracy implementation has become a common request. The correction information that has become absolutely necessary for this OPC's high-accuracy implementation is the measurement on the enormous amount of two-dimensional shape as well as the measurement on the one-dimensional shape.

Moreover, the microminiaturization has made smaller and smaller the degree of allowance of the pattern shape in the transfer. Namely, the management of a dangerous location (i.e., hotspot) in the product-device fabrication is becoming necessary for maintaining and enhancing the yield. The stationary measurement on a two-dimensional hotspot is important as an in-line monitor. The degree of completion of the automated-measurement-used measurement recipe for this stationary measurement is becoming important.

In the embodiments that will be explained hereinafter, in view of the above-described situation in the semiconductor measurement, the explanation will be given below concerning a device or the like for creating the measurement recipe easily. More concretely, the explanation will be given below regarding a device or the like tor performing the creation of a measurement recipe, or the verification of validity of the measurement recipe without using a measurement device (such as, e.g., CD-SEM (: Critical-Dimension Scanning Electron Microscope)). Here, the measurement recipe is used when measuring semiconductor-light-exposure-used mask shape, and silicon shape, i.e., exposed semiconductor-transferred pattern, in the semiconductor fabrication processes. The verification of validity of the measurement recipe is performed as follows: Namely, the emulation of a pattern image is performed which is formed on a measurement-target mask or wafer. In this way, the measurement recipe is executed in a pseudo manner, thereby verifying the validity of the measurement recipe. This verification makes it possible to correct the measurement recipe properly thereby allowing efficient implementation of the recipe's operation in the semiconductor fabrication processes.

Figure 2:
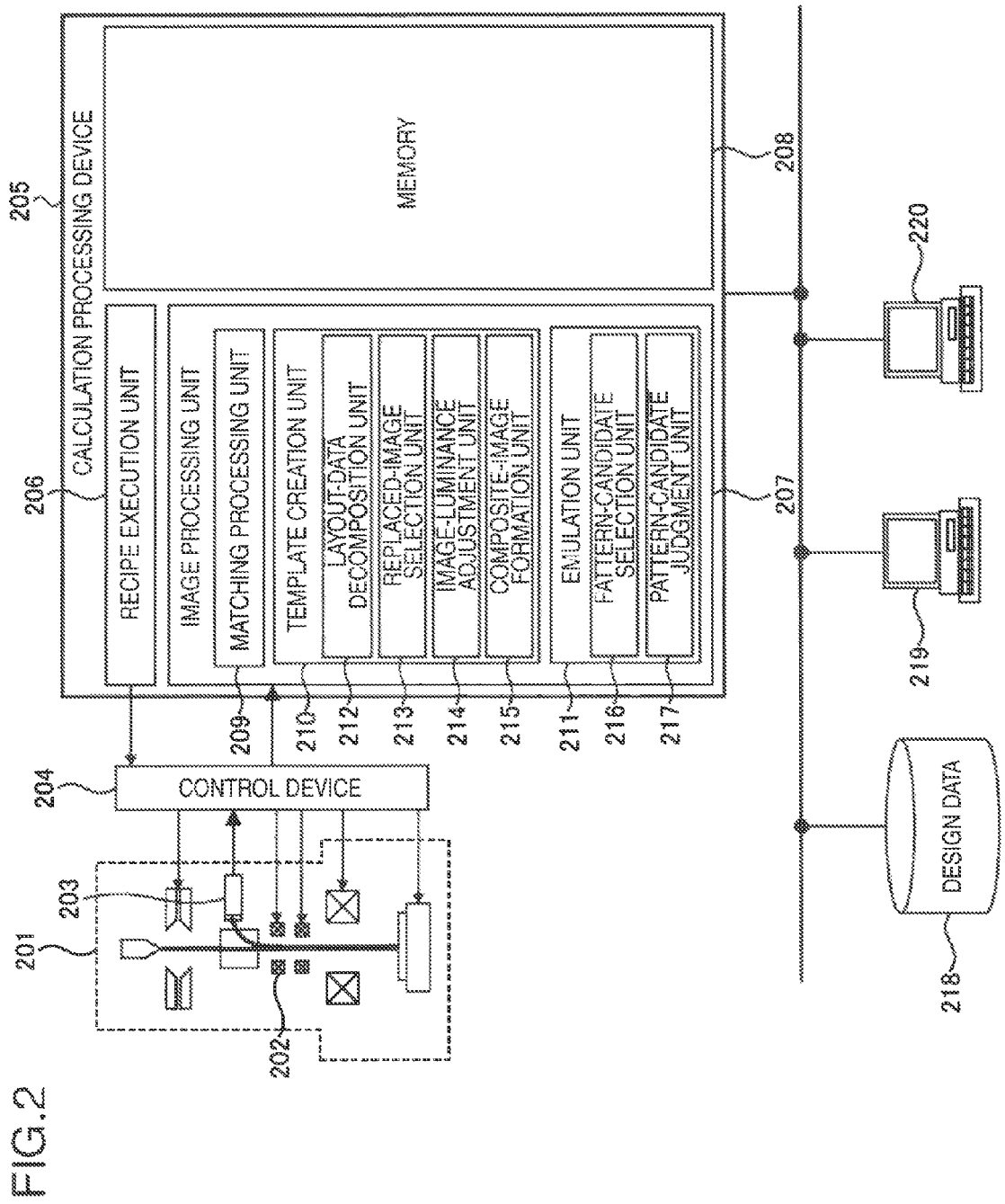
FIG. 2 is a diagram for illustrating an example of the semiconductor measurement (or inspection) system.

FIG. 2 is a detailed explanatory diagram of a semiconductor measurement/inspection system including a SEM. The present system includes a SEM's main body 201, a control device 204 for the SEM's main body 201, and a calculation processing device 205. The calculation processing device 205 builds in a recipe execution unit 206 for supplying a predetermined control signal to the control device 204, an image processing unit 207 for performing an image processing of an image that is obtained by arranging detection signals obtained by a detector 203 in synchronization with the scanning by a scan deflector 202, and a memory 208 for storing the image information acquired, and recipe information to be executed in the recipe execution unit 206. The measurement recipe is an operation program for causing the SEM to operate automatically. The measurement recipe is stored into the above-described memory 208 or an external storage medium for each type of samples that are to become the measurement targets. The measurement recipe is then read therefrom, depending on the requirements.

Secondary electrons emitted from the sample are captured by the detector 203, then being converted into a digital signal by an A/D converter which is built in the control device 204. Moreover, the digital signal is subjected to a purpose-responding image processing by image processing hardware such as CPU, ASIC, and FPGA, which are built in the image processing unit 207. Also, the image processing unit 207 is equipped with a function of creating a line profile based on the detection signal, and measuring the dimension between peaks of the line profile.

Furthermore, the calculation processing device 205 is connected to an input-unit-set-up input device 219. A display device set up on the input device 219 is equipped with such functions as the GUI (: Graphical User Interlace) function of displaying images and inspection results to the operator.

Incidentally, a partial or entire portion of the controls and processings in the calculation processing device 205 can also be controlled/processed by allocating the partial or entire portion to a computer that installs therein a CPU and an image-accumulation-capable memory. Also, the calculation processing device 205 can operate as a photographing-recipe creation device as well. Here, the photographing-recipe creation device creates a photographing recipe manually, or by utilizing the design data on the electronic device (which is stored into a design-data storage medium 218). This photographing recipe includes such data as pattern-matching-dedicated templates and photographing conditions used for the electronic device's coordinate/position determination needed for the inspection.

The input device 219 includes a template creation unit for cutting out a partial portion of the line-segment image formed based on the design data, and employing this partial portion as the template. The template created is then registered into the memory 208 as a template-matching-used template in a matching processing unit 209 that is built in the image processing unit 207. The template-matching technology is a technique where the location at which a photographed image that becomes the position-alignment target and the template coincides with each other is identified based on the coincidence-degree judgment using the normalized correlation method or the like. The matching processing unit 209 identifies a desired position of the photographed image based on the coincidence-degree judgment. Incidentally, in the present, embodiment, the degree of the coincidence between the template and an image is expressed using the term of "coincidence degree" or "similarity degree". The coincidence degree and the similarity degree, however, are exactly the same in the meaning of an indicator for indicating the extern of the coincidence between the template and an image. Also, "non-coincidence degree" or "non-similarity degree" is an aspect of the coincidence degree or the similarity degree.

The embodiments that will be explained hereinafter relate to a pattern matching between the edge information that is obtained mainly based on the design data, and the photographed image that is photographed by the SIM or the like. Here, the edge information obtained based on the design data is as follows: The line-segment image information indicating a pattern's ideal shape, and formed based on the design data, or the line-segment image information to which a modification processing for making this image information close to the actual pattern is applied. Also, the design data is expressed using, e.g., the GDS format or OASIS format, and is stored in the predetermined form. Incidentally, whatever type of the design data is allowable, as long as design-data-representing software can represent its format's form, and can be addressed as graphics data.

Incidentally, in the embodiments that will be explained hereinafter, the explanation will be given below regarding an example of a SEM-installed control device, or an example where the matching processing is executed in the calculation processing device 205 that is connected to the SEM via a communications line or the like. These embodiments, however, are not limited to these examples. Namely, a processing that will be described later may also be performed using a general-purpose calculation device for executing the image processing based on a computer program. Moreover, a technique that will be described later is also applicable to the other charged-particle beam devices such as a focused ion beam (: FIB) device.

The present embodiment relates to a device for performing the pattern matching, a program for causing a computer to execute the pattern marching, and a storage medium for storing this program.

Embodiment 1

As described earlier, the automated operation of the measurement in the semiconductor fabrication processes occupies an important role in the efficient implementation of the entire production steps. On account of the factors that will be pointed out hereinafter, however, the measurement-recipe-based automated operation of the measurement has become an obstruction to the implementation of an enhancement in the automated ratio.

In the semiconductor fabrication, the pattern shape is formed on a silicon wafer by a light-exposure device, using a mask-reticle that is created based on pre design data in order to transfer the corresponding target pattern. Also, in etching steps, a desired pattern is formed by removing unnecessary portions by the etching on the target pattern.

In the wafer pattern formation, a variety of variation factors in the above-described semiconductor fabrication steps result in a variation in the pattern dimension that becomes the measurement target. As a result, in many cases, the pattern is not formed as a desired ideal pattern shape corresponding to the design data. In particular, the pattern shape in the etching steps sometimes exhibits a significant gap of this kind.

Also, in the fabrication of a mask-reticle used for the light-exposure, an ideal mask shape corresponding to the design data is not formed in some cases. This is caused to occur by such factors as an error in the electron-beam light-exposure time for the mask graphics-drawing, and a variation in the etching in the mask fabrication. As a result, the shape of the transferred pattern exposed using this mask-reticle is varied in some cases.

Moreover, in the measurement, there exists the following possibility: Namely, a shift of the measurement position is caused to occur for each measurement device used in the measurement. This shift is caused to occur by machine-difference factors on each measurement-device basis (e.g., a variation in the stage coordinate accuracy, and a variation in the electron-beam shift accuracy). Also, in some cases, the measurement of a pattern cannot be made with a desired position accuracy. This is because the preciseness of the position determination becomes lowered by the shape-uniqueness problem of a pattern whose measurement-dedicated position determination is performed in the measurement recipe.

Also, consideration is given to a wafer (i.e., FEM (: Focus Exposure Matrix) wafer) in which the dose or focus condition of the light-exposure device is sequentially changed within the wafer surface for the purpose of the verification of a process margin or the like. In the measurement of this FEM wafer, the shape of the pattern becomes different from each other under each condition changed. Accordingly, in many cases, an error occurs in the measurement. In summary, the mentionable factors for the measurement errors are as follows: (1) deformation of the wafer pattern due to a process variation, (2) difference between the pattern shape (i.e., light-exposure result) formed via lithography steps, and the pattern shape formed via the etching steps, (3) variation in the stage coordinate accuracy on each measurement-device basis, (4) lack of the stability of a measurement-position-determination-dedicated addressing pattern, (5) existence of a wafer pattern like the FEM wafer, whose shape change in the chip unit is significant.

The existence of the factors as described above gives rise to occurrence of the measurement errors. Examples of these measurement errors are as follows: A failure in the image-photographing, a shift of the measurement region due to the failure in the image-photographing, or selecting and employing an other-than-target-patterns pattern as the measurement target.

Under the present circumstances, a countermeasure taken against these measurement errors is as follows: Namely, after an actual mask or wafer is fabricated, a recipe's execution test (such as adjustment of the measurement parameter, or replacement of the matching-used template) is performed using this actual mask or wafer. This situation gives damage to the target, or necessitates m extra time until the actual measurement, thereby becoming a bottleneck in the fabrication processes. Essentially speaking, it is required to complete the automatization-dedicated measurement recipe before the wafer is fabricated, and to make the automated measurement timely at the wafer-fabricated point-in-time.

In the present embodiment, in particular, the explanation will be given below concerning an image processing device that makes it possible to form the pattern image that is close to a SEM image, before the measurement on the wafer or the like is performed. FIG. 1 is a flowchart for illustrating steps through which the image that is close to a SEM image is formed before the SEM image is formed. In the present embodiment, in particular, the explanation will be given below regarding an example where the image is formed based on the design data. First, at a step S101, the design data is read from the design-data storage medium 218. Then, based on the design data, graphics data is created using a simulator 220 or the like (step S102). In the simulator 220, the graphics data is created based on a deformation processing in response to the light-exposure condition or the like. Also, here, it is allowable only to configure graphics implementation of layout data on the pattern.

Next, in a layout-data decomposition unit 212 included in a template creation unit 210, the graphics data created is decomposed based on a predetermined condition (step S103). In this case, the area division is made in accordance with a size unit that becomes the same size (i.e., same field-of-view (: FOV) size) as a sample area. Here, this sample area is displayed in an image that is registered into a library (which will be described later). For example, in the case of an L-character-shaped pattern exemplified in FIG. 1, this pattern is divided into three areas, i.e., the areas A to C.

Next, the reading of pattern-image formation conditions is performed which are as follows: Pattern shape, pattern deployment condition, pattern fabrication condition, and SEM-image formation condition (i.e., beam condition) corresponding to each of the areas A to C (step S104). In the reading of them like this, concerning the pattern shape and the pattern deployment condition, they may be automatically read based on the area selection, or then arbitrary input from the input device 219 may also be made possible. This is because the pattern shape and the pattern deployment condition are information registered in advance into the original design data. Also, the pattern fabrication condition may be read from the design data, if it is registered into the design data. Otherwise, its arbitrary input from the input device 219 may also be made possible.

Regarding the SEM-image formation condition, its different and separate setting needs to be performed. This is because, usually the SEM-image formation condition is not registered into the design data. If, for example, some type of default information is present, this default information may be read.

Incidentally, the extent of a change in the pattern shape, which is caused by the OPE (: Optical Proximity Effect), is changed by the extent of the loose/dense of the pattern deployment. Accordingly it is desirable to add, as the setting conditions, not only the pattern shape, but also the pattern deployment condition (i.e., the extent of the loose/dense). Concretely, it is preferable to classify the types of the patterns for each distance between a target-pattern-most-proximate pattern and the target pattern, or for each size of the proximate patterns. Also, if there exist the other variation factors tor the pattern shape, it is preferable to classify the types of the patterns for each of these other variation factors.

At a step S105, reference is made to the library on the basis of the pattern-image formation conditions read above. As exemplified in, e.g., FIG. 5, the library is the following database: Namely, the types of patterns (Pattern: pattern shape, pattern deployment condition, pattern material, and the like), the process condition (Process condition: focus and dose amounts of the light-exposure device or the like), and the SEM-image formation condition (SEM condition: an POV size of electron microscope, an acceleration voltage, a frame number, a beam current, an attainment energy of beam, and the like), and registered images (Registered image data) are stored into this database in a manner of being made related with each other. Incidentally, this combination is only an example. Namely, the library may also be constructed by selectively using the SEM-image-formation-condition-including information that exerts tremendous influences onto how a pattern looks.

Figure 4:
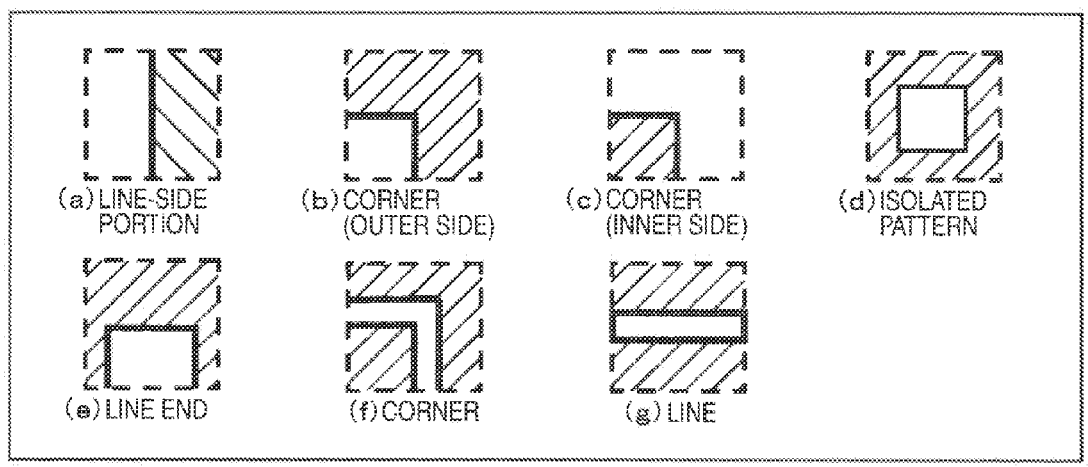
FIG. 4 is a diagram for illustrating examples of registered images on each pattern-region basis, which are registered into the library.
Figure 12:
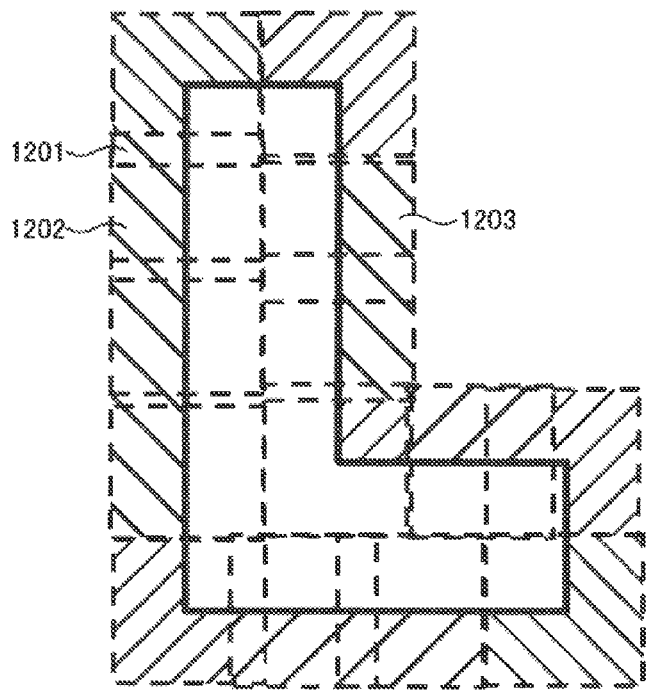
FIG. 12 is a diagram for illustrating an example where the composite image is formed.

The registered images are accumulated as fellows: Namely, images, which are acquired with different samples and at different measurement steps, are classified in advance depending on a combination of the respective conditions, then being accumulated. FIG. 4 is a diagram for illustrating examples of the registered images. A pattern shape is a geometrical shape that, basically, consists of a straight-line portion and a corner portion. Accordingly, three pattern classifications of a straight-line portion and corner portions axe prepared like, e.g., (a) to (c) In FIG. 4. Then, performing a combination of these three pattern classifications as is exemplified in FIG. 12 makes it possible to form a composite image. The reason why the registered images are registered in a manner of being divided on each pattern-region basis is the implementation of a data-amount reduction by simplifying the library. Depending on the requirements, however, more complicated shapes may also be registered into the library. The typical patterns that are conceivable as these more complicated shapes are as follows: An isolated pattern as is exemplified in (d) in FIG. 4, a line end as is exemplified in (e) in FIG. 4, a corner as is exemplified in (f) in FIG. 4, and a line as is exemplified in (g) in FIG. 4. The isolated pattern is a composite image that is composed of the four corners exemplified in (b) in FIG. 4. In this way, the library may also be constructed by selecting the shapes of the registered images, depending on the situations such as the pattern-formed state and the frequently-used patterns.

Incidentally, at the step S105, a registered image is read which is stored in a manner of being made related with a condition that is the same as a pattern-image formation condition selected, or a condition that can be regarded as the same as the pattern-image formation condition selected. Additionally, it is preferable to construct the library by updating it as follows: Namely, in the library, a plurality of registered images are made registerable with respect to a single pattern type. Simultaneously, an image acquired at the measurement time is divided into a plurality of image areas. Simultaneously, this image is made registerable in relation with a pattern-image formation condition at that time.

At a step S106, a composite-image formation unit 215 forms a composite image on the basis of registered images (e.g., Ax, By, Cz in FIG. 1) which are selected by a replaced-image selection unit 213. The composite image formed in this way is an image about which the pattern fabrication condition, the pattern condition (such as deployment and shape), and the SEM-image formation condition coincide with each other. As a result, the composite image formed is the high-accuracy pseudo image about which the plurality of pattern-image formation conditions are in agreement with each other.

Figure 7:
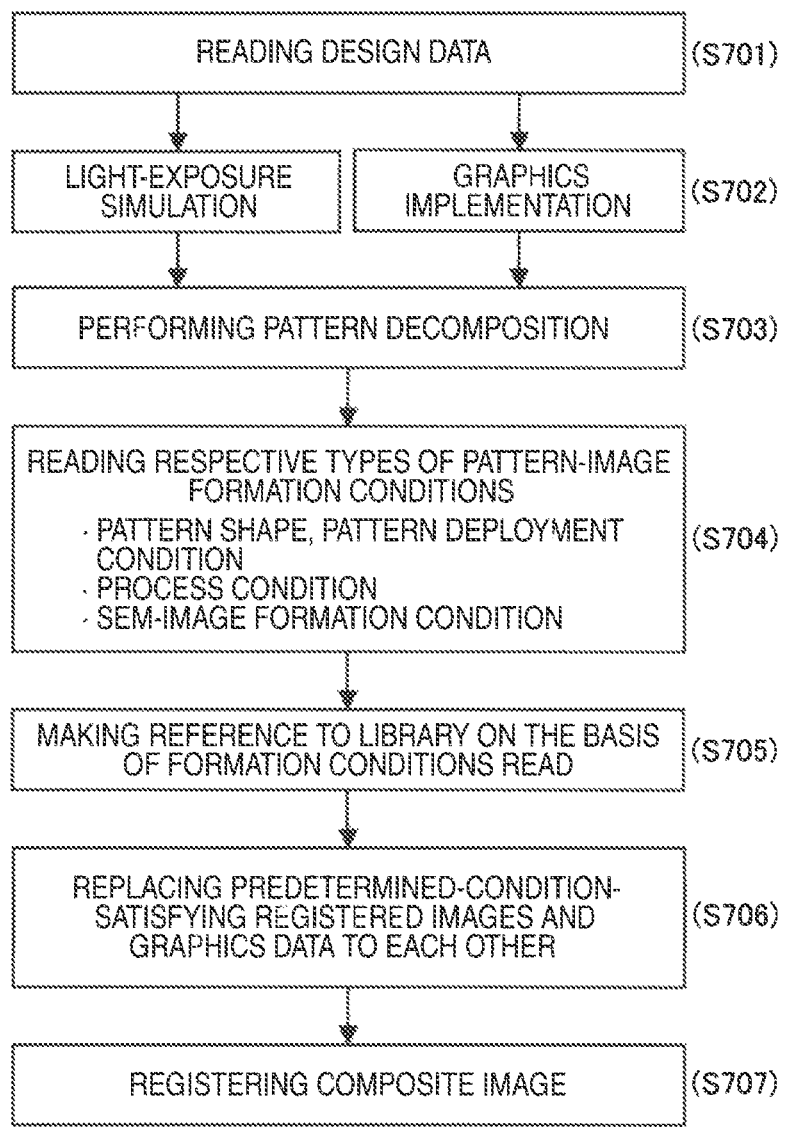
FIG. 7 is a flowchart for illustrating steps through which the composite image (i.e., pseudo image) is formed based on the reference made to the library.

Also, when performing the image composition, the image formation may also be performed by superimposing partial portions of the respective registered images on each other. By setting up a superimposition area, and performing a position alignment such as a pattern matching processing within this area, it becomes possible to perform the high-accuracy position alignment. When performing the pattern matching, a processing is performed which allows the edges to overlap with each other. In order to set up the superimposition area in this way it is preferable to set the size of each decomposed area, which is acquired by the pattern decomposition carried out at the step S103, at a size that is smaller than each registered image stored into the library. Also, setting up the rotation function of a registered image makes it possible to decrease the number of the images needed for the registration, thereby allowing implementation of simplicity of the library. For example, in the case of FIG. 12, a registered image 1202 and a registered image 1203 are identical to each other. Accordingly, rotating one image by the amount of 180 degrees allows the other image to be obtained. In this case, the composite-image formation unit 215 extracts line-segment information on each area of the pattern from the design data, then performing the rotation processing on the basis of this line-segment information. Incidentally, as is exemplified in FIG. 7, it is also allowable to merely replace registered images and decomposed images to each other (step S706). Steps S701 to S705, and S707 of a flowchart exemplified in FIG. 7 are the same as the steps S101 to S105, and S107 exemplified in FIG. 1.

The composite image formed as described above is registered into a storage medium such as the memory 208 (step S107), thereby terminating the entire processing. The composite image formed can be used as the template-matching-used template in the matching processing unit 209. The template is formed by way of the processing steps described so for. This template-forming scheme makes it possible to create the template that is close to the SEM image, using the already-existing registered images, and without causing the SEM to operate.

Embodiment 2

Figure 9:
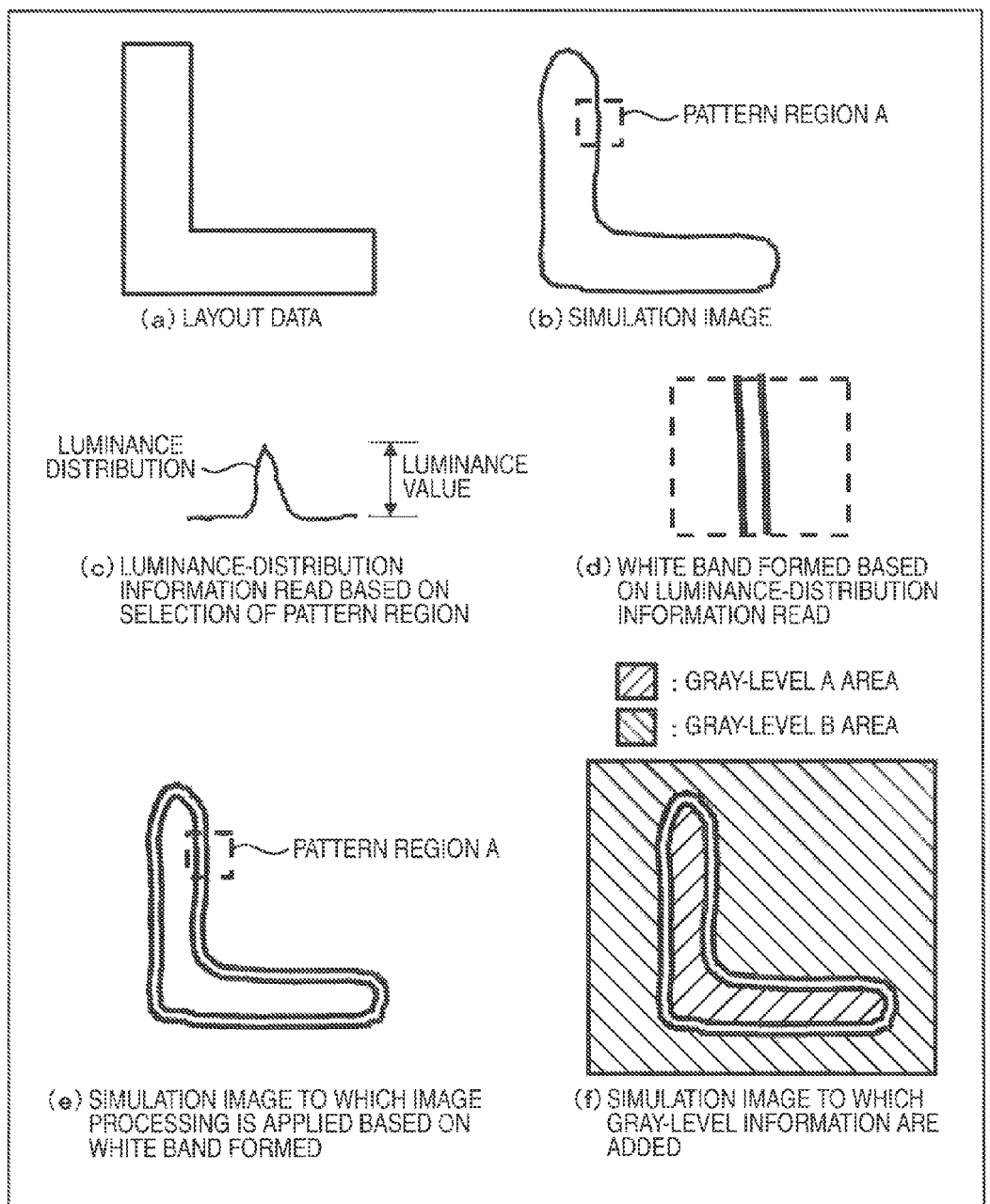
FIG. 9 is a diagram for illustrating steps through which the composite image is formed based on the registered edge adjustment information and gray-level information.
Figure 10:
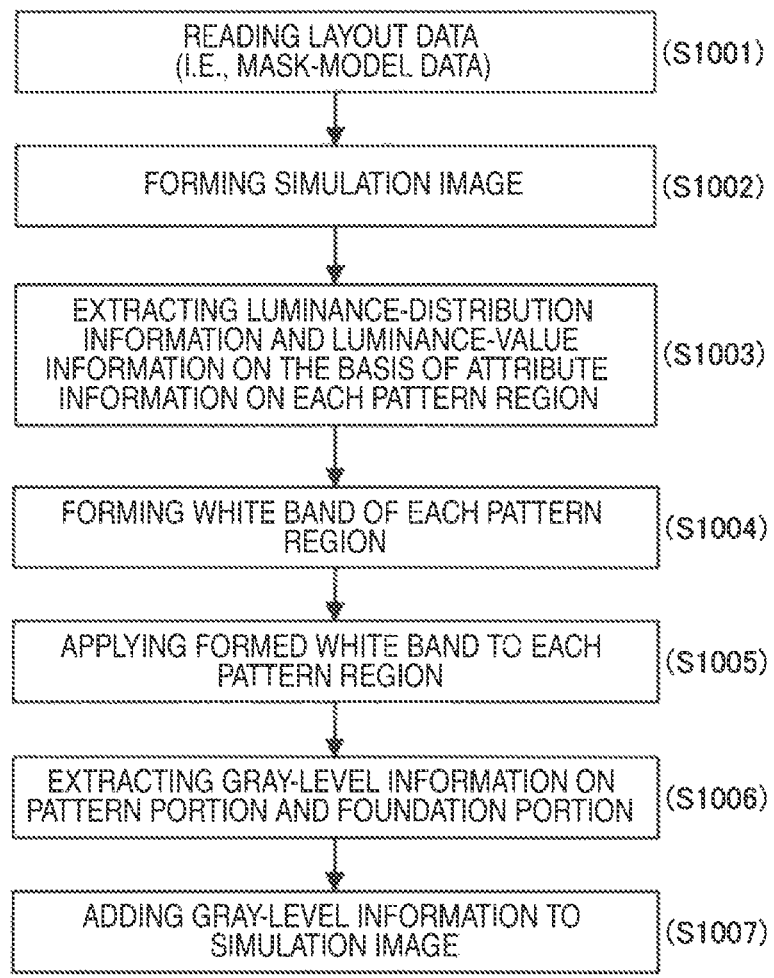
FIG. 10 is a flowchart for illustrating steps through which the composite image is formed based on the registered edge adjustment information and the gray-level information.

Next, the explanation will be given below concerning an example where the pseudo image is formed not by registering the images, but by performing an image processing. FIG. 9 is a diagram for illustrating steps through which the pseudo image is formed based on this image processing. FIG. 10 is a flowchart for these steps. First, the layout data is read from the design-data storage medium 218 (step S1001). Next, the light-exposure simulation is carried out using the simulator 220 (step S1002). Moreover, a simulation image, which is obtained by the simulation, is decomposed in the layout-data decomposition unit 212. After that, luminance-distribution information and luminance-value information are extracted from the library, depending on the attribute information on each decomposed area (step S1003). Incidentally, in the present embodiment, the explanation will be given regarding only the pattern region A (i.e., one of the decomposed areas).

FIG. 6 is a diagram for illustrating an example of the library that is employed in the present embodiment. The point in which the present library differs from the library exemplified in FIG. 5 is as follows: Namely, data stored therein in a manner of being made related with the types of patterns are not the registered images, but feature information on the images. Here, the feature information are pattern edge's luminance value (brightness), approximate function for indicating edge portion's luminance distribution (distribution), and luminance values (gray level 1 and gray level 2) of other-than-edge-portion pattern portion and background (i.e., foundation portion). The pseudo image is formed by processing the layout data or simulation image on the basis of the feature information like this. The attribute information the pattern region A are the types of patterns (shape and deployment), the fabrication condition, and the SEM-image formation condition. The luminance value of the edge portion (i.e., white band) is adjusted based on the luminance-distribution information and the luminance-value information stored in a manner of being made related with the attribute information (step S1004). The original layout data or simulation image is the line-segment information for indicating the contour of a pattern. Accordingly, the luminance adjustment of each pixel is made so that a width is provided in the vertical direction of the line-segment (step S1005). Next, the gray-level information on the pattern portion and foundation portion are read from the library (step S1006). Finally, the gray-level information is added to the simulation image (step S1007). Based on the above-described information read, an image-luminance adjustment unit 214 executes the luminance adjustment of each pixel as described above.

The image formed via the processing steps as described above becomes an linage that is equipped with the white band similar to that of the SEM image, and the luminance information on the pattern portion and background portion. As exemplified in FIG. 6, the use of the library in which the feature information is selectively extracted makes it possible to reduce the library's data amount as compared with the case where the image information is registered. The composite image of the registered images, however, is an image that is closer to the actual SEM image. Consequently, if the higher priority is given to the image-formation-completed level, it is desirable to perform the composite-image formation based on the registered images.

The composite image formed as described above is registered into the storage medium as the template, thereby terminating the composite-image formation steps.

Embodiment 3

The explanation given so far has related to the case where the composite image (i.e., pseudo image) is registered as the template. In the following explanation, however, the explanation will be given regarding the following case: Namely, the pseudo image is used as a verification image for the verification of an already-existing template, or a newly-created template. In other words, the present explanation relates to a device or the like for performing the verification or the like of validity of a measurement recipe. Here, the measurement recipe is used when measuring semiconductor-light-exposure-used mask shape, and silicon shape, i.e., exposed semiconductor-transferred pattern, in the semiconductor fabrication processes. The verification like this, and the verification-based correction of the measurement recipe are performed properly. These operations allow implementation of an enhancement in the production efficiency in the semiconductor fabrication processes.

In the present embodiment, in order to perform the verification of the measurement recipe, the transfer simulation is performed with respect to the shape of the design data (e.g., GDS data) that becomes the measurement target. This transfer simulation is performed, using the position information on the measurement target, and position-determination-performing template shape which are defined in the measurement recipe registered in advance. Moreover, based on the shape's pattern, and using a similar image prepared in advance, the matching is performed between an image outputted from the pseudo-image-creating image creation unit, and the position-determination-performing template shape defined in the measurement recipe. In this way the measurement is executed in a pseudo manner with respect to the pseudo image.

Namely, the pseudo image explained in the embodiments described earlier is employed as the to-be-searched image in the template matching. Furthermore, the validity of the template is verified by performing the template matching where the in-advance-registered template is used. The pseudo image is formed in substitution for the image acquired by the SEM. Namely, the calculation processing device 205 exemplified in FIG. 2 operates as an emulator for substantially performing the same processing as the processing perforated by the SEM.

Figure 11:
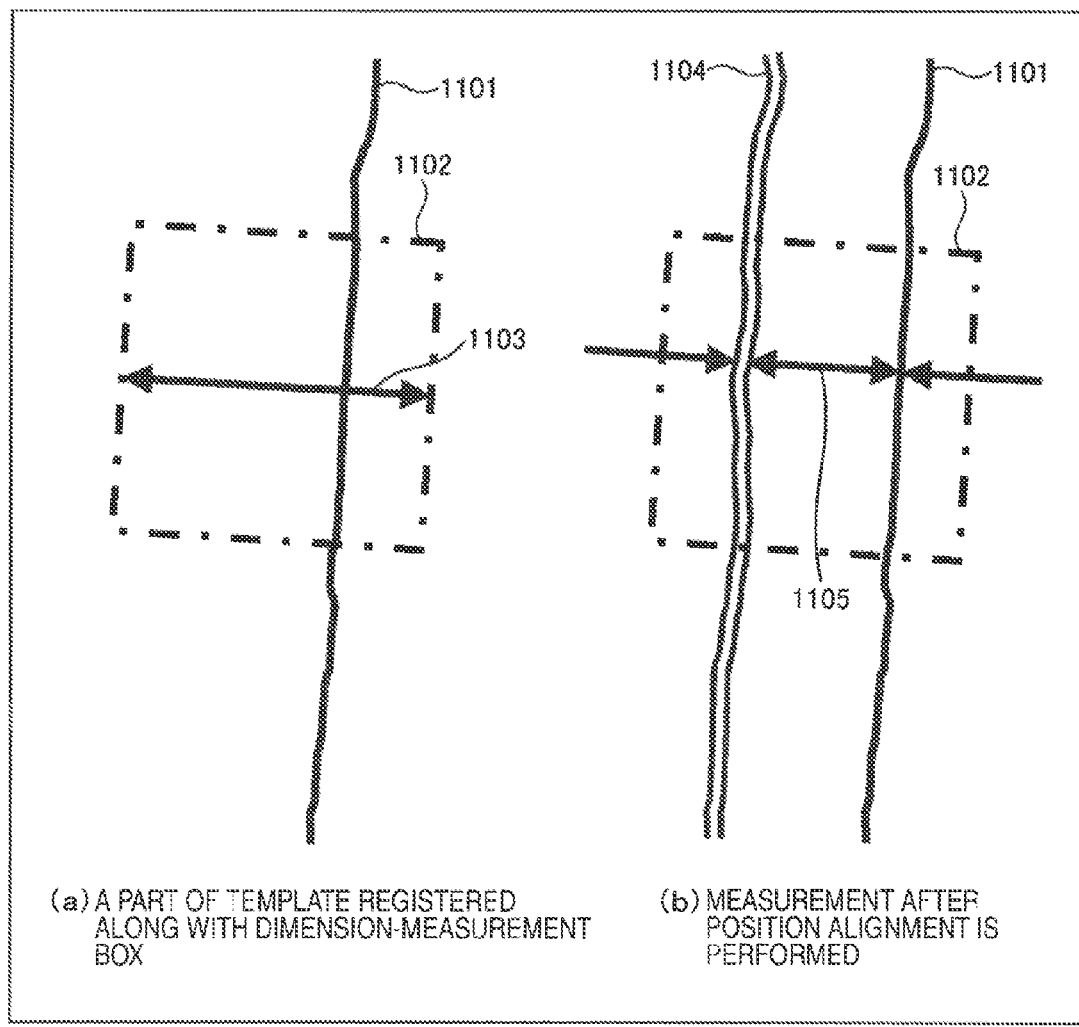
FIG. 11 is a diagram for illustrating an example where the dimension measurement is executed regarding a dimension-measurement region that is stored in a manner of being made related with the simulation image.

FIG. 11 is a diagram for illustrating a partial portion of the following template: Namely, in this template, line-segment information 1101 and a dimension-measurement box 1102 are registered along with each other. This registration is performed in order to measure the distance between the line-segment information based on the design data, and the SEM edge (op contour line formed based on the SEM edge). According to the example in FIG. 11, a measurement direction 1103 is also registered along therewith as the template information. At the time of the actual measurement, the pattern matching is executed between the template composed of graphics data, including the line-segment information 1101, and the SEM image (i.e., pattern 1104). Moreover, the dimension measurement is made by measuring a distance 1105 between the line-segments whose position alignment is performed. The measurement like this is referred to as "EPE (: Edge Placement Error) measurement". This EPE measurement is an important measurement method for the yield-enhancing method that is referred to as "DFM (: Design For Manufacturability)" method. In the DFM method, the countermeasure is taken by retailing back to the design data on the basis of the pattern-formation-completed level in particular. This measurement is a technique for making the measurement where the design-data-based line-segment, or the simulation image's line-segment is selected as its criterion. Accordingly the template is formed using these line-segments. The following recipe-verifying method is specifically effective for the verification of the template that is formed by selecting the design data as the criterion in this way.

There has been known the technique where the template is created based on the design data, and via the steps such as the simulation. The verification of the template, however, requires that the SEM be actually operated, and that the matching processing be actually performed. In the present embodiment, the matching processing is performed by utilizing the pseudo image. This scheme allows implementation of the verification of the template where the actual SEM image is not used.

Concretely, the pseudo image is created horn the simulation result. Furthermore, the matching between this pseudo image, and the measurement template defined in the measurement recipe is performed in a pseudo manner. This scheme allows implementation of the emulation of the measurement.

The configuration for implementing the verification as described above is as follows: The pseudo-image creation unit (i.e., template creation unit 210) for creating the pseudo image using an in-advance-prepared similar image, and based on the simulation, the matching processing unit 209 for executing the matching processing between the pseudo image and the template, and an emulation unit 211 for making the judgment as to whether or not the template is formed properly, or outputting information needed for making this judgment.

Figure 3:
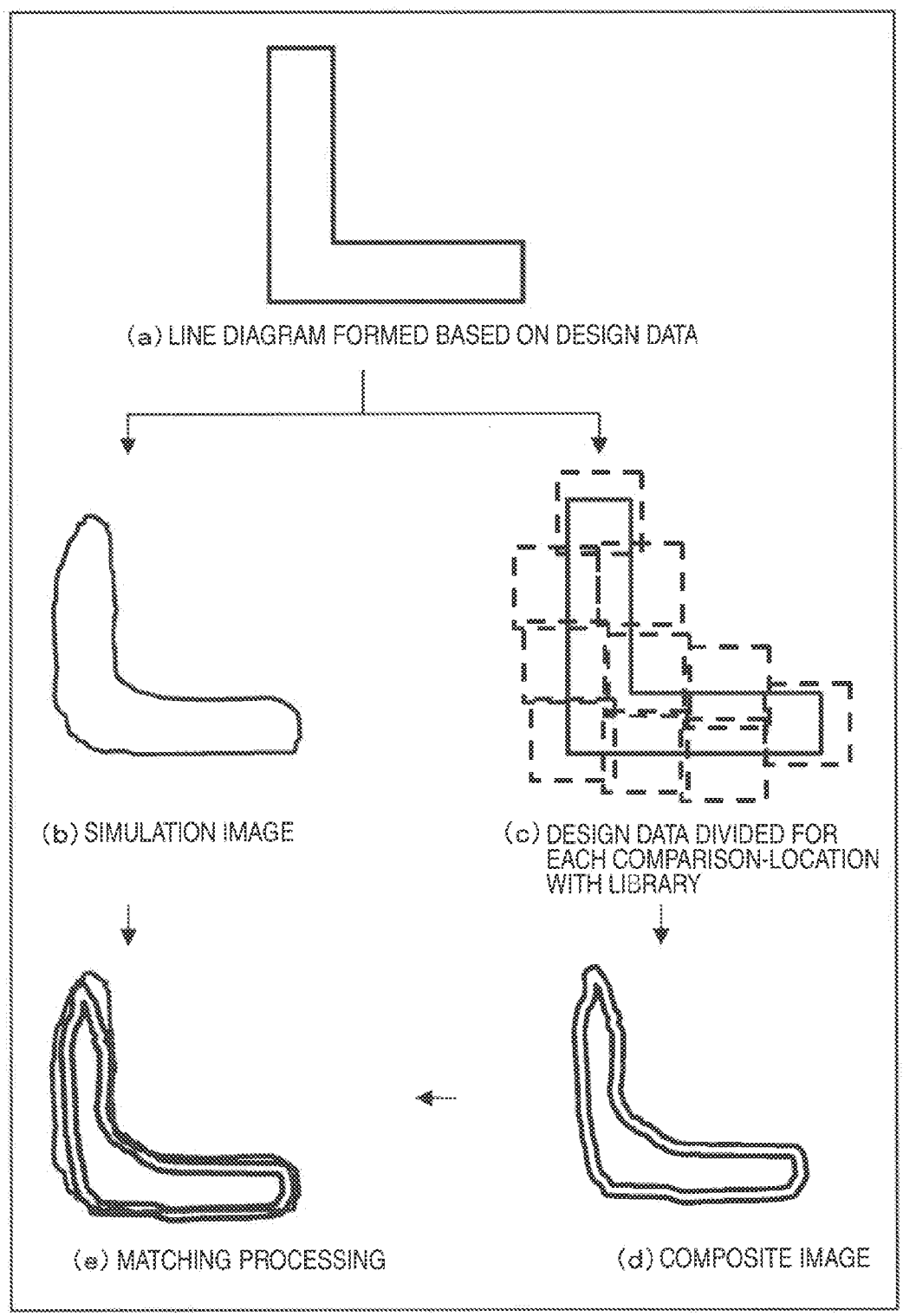
FIG. 3 is a diagram for illustrating matching processing steps between a simulation image and the composite image.
Figure 13:
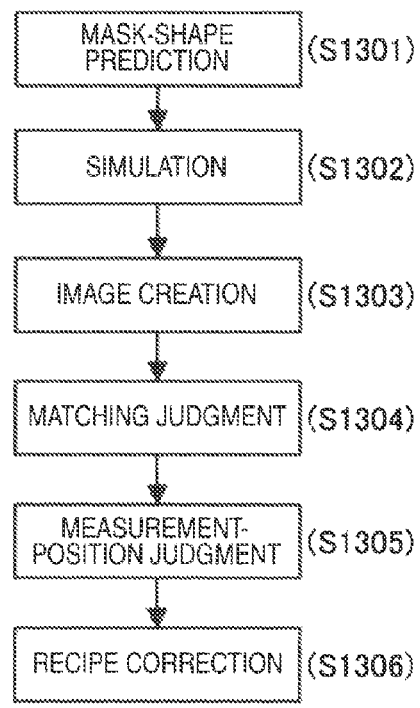
FIG. 13 is a flowchart for illustrating recipe's verification steps using an emulator.

The template verification steps using the emulator like this, basically, become steps that are exactly exemplified in FIG. 13. Also, FIG. 3 illustrates steps through which the simulation image and the composite image (i.e., pseudo image) are formed based on the design data, and the matching processing therebetween is performed. First, a mask-shape prediction based on model data on the mask-formation-completed level is executed (step S1301). Next, the transfer simulation is carried out based on the design data (step S1302). Still next, the pseudo image is created from an image-data group that is prepared in advance (step S1302). Moreover, the template-used matching processing is applied to the pseudo image created (step S1304). Furthermore, the judgment is made as to whether or not the measurement position, whose position alignment is perforated by the matching processing, is positioned at a proper position (step S1305). Finally, the correction for the recipe is made, depending on the requirements (step S1306). The judgment as to whether or not the measurement position is positioned at a proper position may be made as follows: Namely, in order to allow the visual verification, the after-matching superimposed image is displayed on the displayed image. Otherwise, it is judged by a threshold-value judgment that the dimension-measurement value exhibits an obviously abnormal value, and this result is outputted. The following processings are performed at the respective steps exemplified in FIG. 13.

(A) Step S1301 (The Mask-Shape Prediction Based on the Model Data on the Mask-Formation-Completed Level)

As the preparation for creating the pseudo image, the formation-completed-level prediction on a wafer-transfer-used mask-reticle is performed. This prediction is performed, using the pattern of the design data (e.g., GDS data (: (a) in FIG. 3)) corresponding to the measurement coordinate defined in the recipe. The simulator 220 predicts the formation-completed level of the mask-reticle, using a mask-model database that stores therein mask's fabrication information.

The mask-model database stores therein the following information: (1) influences by the mask-formation-completed level due to the characteristics of a mask graphics-drawing device (i.e., beam shape (○ (circle) or □ (square)), electrons' intensity distribution, in-resist electrons' scatterings (i.e., forward scattering and backward scattering), and the like), (2) etching characteristics (i.e., roughness characteristics caused by resist performance, variation at the time of development, and the like).

The mask shapes predicted in the mask-shape prediction are as follows: The shape of the roundness of inner or outer side of the corner portion of a mask shape, and the shape of a microminiaturized step-difference of the OPC pattern or the like. This mask-shape prediction is performed, using the graphics-drawing characteristics of the mask graphics-drawing machine used in the mask fabrication, and the mask-model database configured by modeling the etching characteristics.

Figure 14:
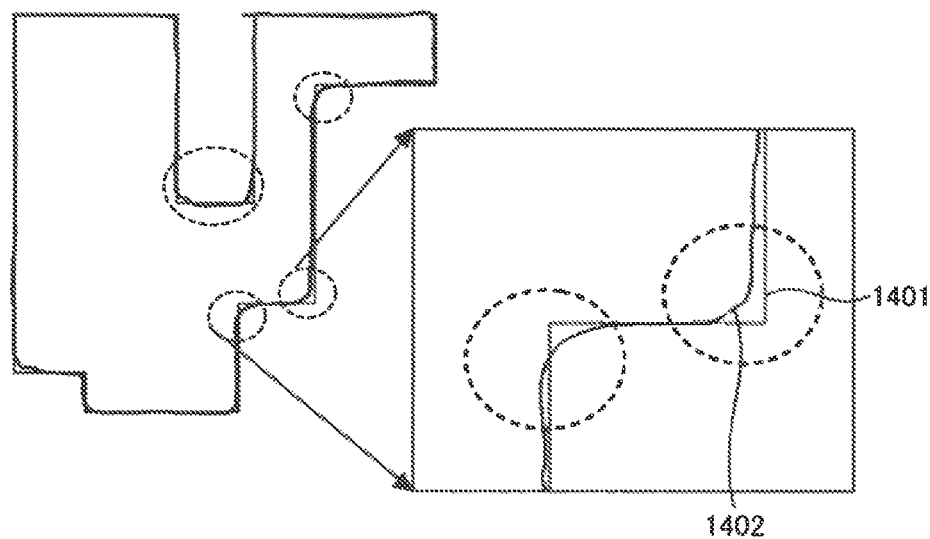
FIG. 14 is a diagram for illustrating the relationship between the mask shape and the mask's predicted shape.

In comparison with the scheme where the simulation of the transferred shape is performed directly from the design data, the execution of this mask-shape prediction allows implementation of the high-accuracy simulation of the transferred shape where the mask-formation-completed level is taken into consideration. FIG. 14 is a diagram tor illustrating the relationship between the mask shape and the mask's predicted shape (i.e., deformed shape obtained by making reference to the mask-model database). In contrast to the mask shape 1401 that is formed in a straight-line manner, the predicted shape 1402 is subjected to a deformation processing that depends on the characteristics of the graphics-drawing device.

(B) Step S1302 (The Transfer Simulation Based on the Design Data)

Figure 15:
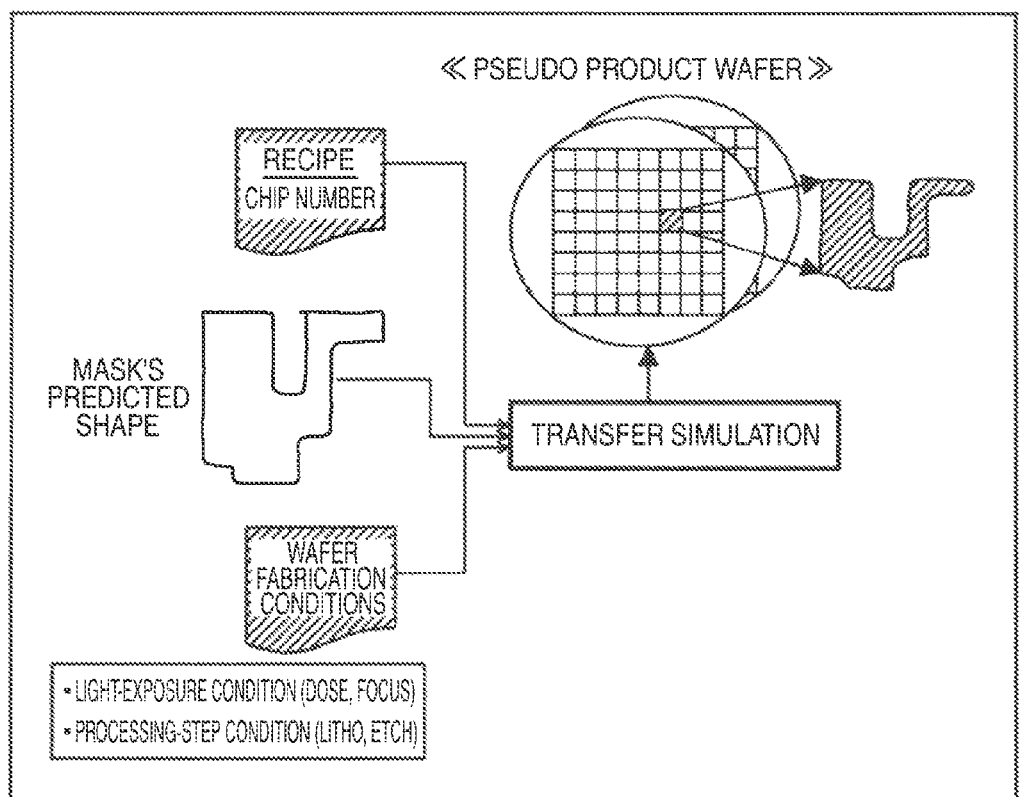
FIG. 15 is a conceptual diagram of the transfer simulation based on the mask's predicted shape.

The simulation of the shape to be transferred onto the wafer is performed, using the mask's predicted shape that is formed at the step S1301, and that is equivalent to the measurement-target portion. FIG. 15 is a conceptual diagram of the transfer simulation. The transfer simulation is performed based on the wafer fabrication conditions, which are (I) the light-exposure condition (: dose and focus), and (II) processing-step condition, i.e., Litho (: lithography) or Etch (: etching).

At this time, the transfer simulation is performed regarding the position of each on-wafer chip (i.e., die) number that is specified in the measurement recipe. Moreover, the resultant shape information is caused to correspond to each on-wafer chip position.

This processing allows implementation of the creation of the measurement target's pattern in each chip within the wafer surface, thereby making it possible to execute the emulation of the measurement (which will be executed later). Incidentally, the virtual wafer state is virtually created, using wafer-size information, chip-size information, and each chip's deployment information specified in the measurement recipe.

(C) Step S1303 (The Pseudo-Image Creation)

Next, the creation of the pseudo image is performed which, becomes the measurement target when executing the measurement recipe. In the present embodiment, the explanation will be given below concerning the calculation processing device 205 (i.e., image processing device) for creating the pseudo image on the basis of the simulation image obtained by the external simulator 220 or the like. The creation of the pseudo image is performed as follows: Namely, the transferred predicted shape, which is obtained by the transfer simulation described earlier undergoes an imaging as an image which is obtained by the SEM. In other words, the SEM image is created, using the transferred predicted shape, and an image library where a lot of SEM images are accumulated in advance.

The image-photographing condition (SEM condition), the sample fabrication condition (Process condition), and the registered images (Registered image data) as exemplified in, e.g., FIG. 5 are stored into the image library in a manner of being made related with each other. The image library like this is prepared on each semiconductor-fabrication-step basis. As an example, as explained in the first embodiment and the like, the design data (: (b) in FIG. 3) divided for each comparison-location with the library, or the simulation image divided for each comparison-location is created in order to allow implementation of the comparison with the library. Furthermore, based on this data or image, the composite image (: (d) in FIG. 3) is created.

Figure 16:
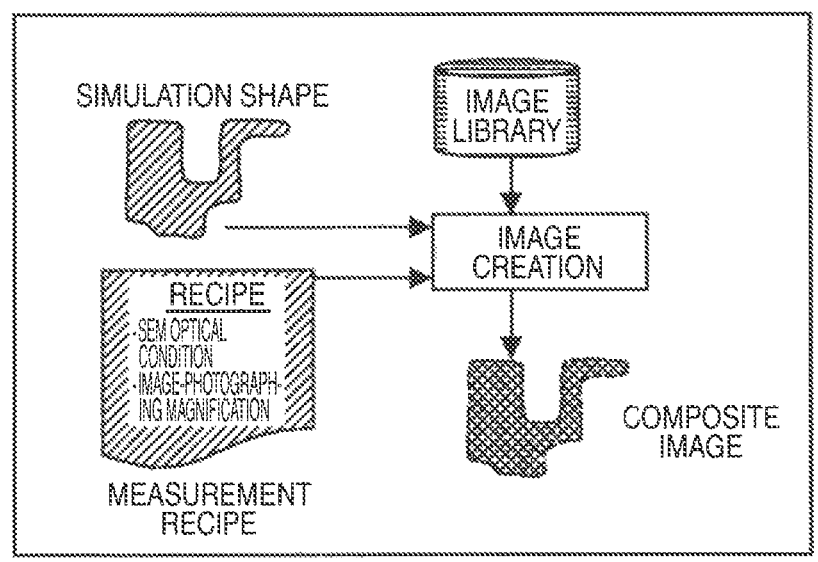
FIG. 16 is a conceptual diagram tor illustrating pseudo-image formation steps.

The configuration of this image library is designed to manage the image on each semiconductor-fabrication-step basis. Concretely, this image library manages an image group that is photographed for each of SEM's electro-optical-system conditions as the image-photographing condition, such as image-acquisition-time acceleration voltage, probe current, integrated-frame number, and the like. Moreover, this image library registers therein the image group for each photographing-pattern's magnification and each pattern size. Consequently, when executing the measurement recipe, the image composition is performed by retrieving an image that satisfies the above-described SEM's electro-optical-system conditions and photographing magnifications defined in the recipe. FIG. 16 is a conceptual diagram for illustrating the pseudo-image formation steps.

In the image composition, the image that satisfies the image-photographing condition defined in the recipe is retrieved and selected from the image library. At this time, the detection of a registered image is performed which exhibits a high pattern's coincidence ratio with the shape of the measurement-target pattern obtained from the simulation. Also, at this time, the search for a similar image is performed in which the pattern's loose/dense is taken into consideration. It is also allowable to analyze the registered image selected by these searches, and to determine the luminance value in the pixel unit.

Also, it is allowable to determine the width of the white band of the image, and the position of the pixel that becomes its center, and to construct the luminance information at the position of each pixel of the simulation shape.

The width and central position of the while band change, depending on the situation of the pattern's loose/dense and the feature amount of the pattern's shape. This situation makes it possible to acquire the high-accuracy pseudo image by analyzing the above-described registered image, which exhibits the high pattern's coincidence ratio with the shape of the measurement-target pattern, and performing a mapping of this information to the simulation shape.

Also, the pattern's size or the image's edge position becomes different on each semiconductor-fabrication-step basis. This situation requires that, as described earlier, the on-each-step-basis image be registered into the image library.

Incidentally, images that have exhibited actual quality-performance in the measurement's operations are registered into the image library. Concretely, a large number of images, such as series types in the fabrication of semiconductor's product devices, are registered in many cases. In the measurements in the fabrication of the product devices, the same shape is measured in many cases. The measurement-target pattern, and the addressing pattern for performing the measurement-dedicated position determination are, in many cases, the patterns that have already exhibited the actual quality-performance in the measurements. This situation makes it extremely effective to apply the above-explained technique of creating the pseudo image by searching for the same shape.

(D) Step S1304 (The Pseudo-Image-Used Matching Processing)

In order to execute the emulation of the measurement recipe, the matching processing (: (e) in FIG. 3) is performed under the same condition as the case where the measurement is actually made using the pseudo image described above. The measurement-performing measurement recipe defines therein the target pattern for indicating the measurement target, and the addressing pattern for performing the position determination. Usually, however, the following two types of schemes are used: (I) scheme of registering the design data as the matching pattern, and (II) scheme of registering the SEM image as the matching-used template.

In the present emulation technique, the matching processing is performed with respect to the above-described two types of data, using the above-described pseudo image. In the present emulation technique, an algorithm is installed which is equivalent to a snatching engine installed on the measurement device. This configuration allows implementation of the high-accuracy emulation.

Incidentally, when executing the matching, reference is made to the accuracy information specific to the measurement device that becomes the measurement target. This operation allows implementation of an enhancement in the evaluation accuracy of the matching result.

Namely, in the present emulation, reference is made to correction information where the stage accuracy or image-shift accuracy occurring specifically on each measurement-device basis is adjusted on each measurement-device basis. In this way, the tolerable range of the position shift occurring at the time of the matching is evaluated in such a manner that this correction information is added thereto. This evaluation makes it possible to estimate the position-determination accuracy of the measurement device, thereby making it possible to judge the matching performance on the basis of the realistic accuracy of the measurement device.

Namely, the coordinate defined in the measurement recipe and the coordinate obtained by the image composition are in a state of being equipped with none of the errors in a logical space (i.e., design-data coordinate system). Accordingly, performing the matching with this state remaining unchanged, in some cases, results in the exhibition of a tendency that its success ratio is high. This situation, in some cases, results in an occasion that the high-accuracy emulation becomes impossible. On account of this circumstance, the matching is performed in such a manner that a variation in the accuracy as an error is added to the above-described coordinate by using the accuracy information on each measurement-device basis.

The above-described emulation allows expectation of the following effects: First, the in-advance verification of the measurement recipe becomes executable which is used for the OPC modeling. The OPC-modeling-used measurement recipe necessitates the measurement of a regularly-repeated pattern in large amounts. Accordingly, before the actual measurement is made, the verification of the measurement recipe is performed using the present emulation device. This in-advance verification allows implementation of the automated operation, thereby making it possible to enhance the operability of the measurement device.

Next, it becomes possible to enhance dm success ratio of the measurement at the time of the FEM-wafer measurement. When measuring the so-called FEM wafer, where the Dose and Focus conditions of the light-exposure device axe modified within the wafer surface, the measurement-target pattern on each chip (I.e., shot) basis within, the wafer surface is deformed, respectively. In the present emulation device, the pseudo image is created on each chip basis in such a manner that the Dose and Focus conditions are taken into consideration. This configuration allows on-each-chip-basis adjustment of the dimension-measurement-dedicated parameters, thereby making it possible to enhance the success ratio of the measurement.

Moreover, it becomes possible to implement the measurement preparation and recipe verification at the stages before the water is fabricated.

Hereinafter, referring to drawings, the explanation will be given below concerning concrete aspects of the emulation. The emulation processing is mainly performed in the emulation unit 211 in FIG. 2. The emulation unit 211 executes the measurement recipe, then performing the verification of its validity. Moreover, the emulation unit 211, depending on the requirements, outputs an instruction for making the correction of a portion of the recipe where there is a possibility of abnormality. Also, as a secondary-stage effect of the emulation, the measurement of the transferred-shape simulation can be performed. Accordingly, the emulation unit 211 can perform the verification of this simulation's model. Hereinafter, the explanation will be given below regarding the main portion of the present emulation unit 211.

(A) The Pseudo-image Creation Unit (i.e., Template Creation Unit 210)

The pseudo image is created which is equivalent to the SEM image of the wafer or mask-reticle that becomes the measurement target. The creation of the pseudo image is performed with respect to all of the measurement coordinates defined in the recipe. This pseudo-image creation is performed, after the transfer-simulation data is acquired using the design data on the wafer or mask-reticle that becomes the measurement target, or the MDP-processed mask data. Also, this transfer simulation is carried out in the simulator 220. Moreover, the processing in the calculation processing device 205 is executed based on this simulation result. When performing the transfer simulation, the transfer simulation using the manufacturing-factor-reflected mask shape is performed in order to reflect the product-formation-finished state where the actual mask-reticle's manufacturability is taken into consideration. This transfer simulation is performed, using the mask model that defines the manufacturability at the mask manufacturing steps.

Next, the creation of the pseudo image is performed based on the predicted shape that is determined in the above-described simulation. When performing the creation of the pseudo image, the SEM image is created, using the transferred predicted shape, and the image library where a lot of SEM images are accumulated in advance. The image library is stored into, e.g., the memory 208, or another storage medium which is accessible from the calculation processing device 205. The configuration of this image library is designed to manage the image on each, semiconductor-fabrication-step basis. Concretely, this image library manages the image group that is photographed for each of SEM's electro-optical-system conditions as the image-photographing condition, such as image-acquisition-time acceleration voltage, probe current, integrated-frame number, and the like.

Moreover, this image library registers therein the image group for each photographing-pattern's magnification and each pattern size. Consequently, when executing the measurement recipe, the image composition is performed by retrieving an image that satisfies the above-described SEM's electro-optical-system conditions and photographing magnifications defined in the recipe.

In the image composition, the image that satisfies the image-photographing condition defined in the recipe is retrieved and selected from the image library. At this time, the detection of a registered image is performed which exhibits a high pattern's coincidence ratio with the shape of the measurement-target pattern obtained from the simulation. Also, at this time, the search for a similar image is performed in which the pattern's loose/dense is taken into consideration.

Next, it is also allowable to analyze the registered image selected by these searches, and to determine the luminance value in the pixel unit, and to make the correction of the luminance value depending on the requirements. In this case, it is advisable to determine the width of the white band of the image, and the position of the pixel that becomes its center, and to construct the luminance information at the position of each pixel of the simulation shape. The width and central position of the white band change, depending on the situation of the pattern's loose/dense and the feature amount of the pattern's shape. This situation makes it possible to acquire the high-accuracy pseudo image by analyzing the above-described registered image, which exhibits the high pattern's coincidence ratio with the shape of the measurement-target pattern, and performing the mapping of this information to the simulation shape.

Also, the pattern's size or the image's edge position becomes different on each semiconductor-fabrication-step basis. This situation requires that, as described earlier, the on-each-step-basis image be registered into the image library.

Incidentally, images that have exhibited actual quality-performance in the measurement's operations are registered into the image library. Concretely, a large number of images, such as series types in the fabrication of semiconductor's product devices, are registered in many cases.

In the measurements in the fabrication of the product devices, the same shape is measured in many cases. The measurement-target pattern, and the addressing pattern for performing the measurement-dedicated position determination are, in many cases, the patterns that have already exhibited the actual quality-performance in the measurements. This situation makes it extremely effective to apply the above-explained technique of creating the pseudo image by searching for the same shape.

(B) The Matching Processing Unit (i.e., Matching Processing Unit 209)

In order to execute the emulation of the measurement recipe, the matching processing is performed under the same condition as the case where the measurement is actually made using the pseudo image described above. The measurement-performing measurement recipe defines therein the target pattern for indicating the measurement target, and the addressing pattern for performing the position determination. Usually, however, the following two types of schemes are used: (I) the scheme of registering the design data as the matching pattern, and (II) the scheme of registering the SEM image as the matching-used template.

In the present emulation technique, the matching processing is performed with respect to the above-described two types of data, using the above-described pseudo image.

In the present emulation technique, the algorithm is installed which is equivalent to the matching engine installed on the measurement device. This configuration allows implementation of the high-accuracy emulation.

Incidentally, when executing the matching, reference is made to the accuracy information specific to the measurement device that becomes the measurement target. This operation allows implementation of an enhancement in the evaluation accuracy of the matching result.

Namely, in the present emulation, reference is made to the correction information where the stage accuracy or image-shift accuracy occurring specifically on each measurement-device basis is adjusted on each measurement-device basis. In this way, the tolerable range of the position shift occurring at the time of the matching is evaluated in such a manner that this correction information is added thereto. This evaluation makes it possible to estimate the position-determination accuracy of the measurement device, thereby making it possible to judge the matching performance on the basis of the realistic accuracy of the measurement device.

Namely, the coordinate defined in the measurement recipe and the coordinate obtained by the image composition are in the state of being equipped with norm of the errors in the logical space (i.e., design-data coordinate system). Accordingly, performing the matching with this state remaining unchanged. In some cases, results in the exhibition of the tendency that its success ratio is high. This situation results in the occasion that the high-accuracy emulation becomes impossible. On account of this circumstance, the matching is performed in such a manner that a variation in the accuracy as an error is added to the above-described coordinate by using the accuracy information on each measurement-device basis.

Next, the judgment is made regarding the matching result. Then, if a shift occurs between the pseudo image and the matching template, the following operations make it possible to enhance the success ratio of the matching: (I) reselection of the addressing pattern on the design data, (II) verification of validity of the addressing-pattern-photographing-used autofocus pattern, (III) verification of validity of the measurement-target-pattern-photographing-used autofocus pattern, (IV) reselection of the matching mode (e.g., switching of the repeated-pattern-used or unique-pattern-used matching algorithm), and the like. Furthermore, the modification of the recipe can also be performed so that the pseudo image created by the pseudo-image creation unit is used as the matching template, depending on the requirements.

(C) The Recipe Setting Unit (i.e., Input Device 219)

The judgment is made as to whether or not the measurement defined in the measurement recipe can be made with respect to the image that is determined in the matching processing unit described earlier. Moreover, the resetting of the recipe is performed, depending on the requirements. Concretely, it is judged whether or not the image can be measured at the dimension-measurement position specified in the recipe. In the image processing unit 207, it is judged whether or not the edge of the image that becomes the dimension-measurement target exists correctly within an area that indicates the width and height of the dimension-measurement region specified in the recipe.

Figure 17:
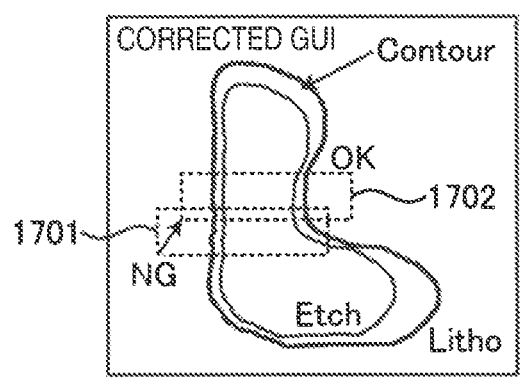
FIG. 17 is a diagram for illustrating the position relationship between a contour-line image and the measurement area.

In this judgment, the contour shape for indicating the shape of the image is extracted From the image, thereby judging whether or not an edge of the contour line exists within the dimension-measurement area. At this time, it is judged whether or not there exists a group of sufficient number of edges that are perpendicular to the direction of the dimension measurement specified in the recipe. FIG. 17 is a diagram for illustrating the position relationship between the contour-line image and the measurement area when the measurement-area-set template is superimposed by the pattern, matching onto the contour line formed from the pseudo image. In the case of the present embodiment, the measurement area 1701 is set which is used for measuring the line-width in the X direction of the L-character-shaped pattern. Of the edges included in the measurement area 1701, however, the right-side-positioned edge is formed in an oblique direction relative to the measurement direction (: X direction) by the optical proximity effect. The execution of the measurement in the state like this, eventually, results in the execution of not the measurement on the line-width, but the measurement including the dimension of a corner portion of the pattern. Accordingly, it is necessary to correct the measurement position onto a proper position. For example, it is necessary to reset the measurement area to the measurement area 1702 that is deployed at the correct position.

In the case of the measurement in proximity to the pattern's corner, in some cases, a crimped contour shape exists as the pattern-formation-finished-state prediction. As a result, there is a possibility that the measurement becomes abnormal or unstable. Consequently, in the case like this, the position of the dimension-measurement area is corrected. By making this correction, the amendment of the recipe is made so that a group of large number of straight dine edges is included within the measurement area.

Figure 18:
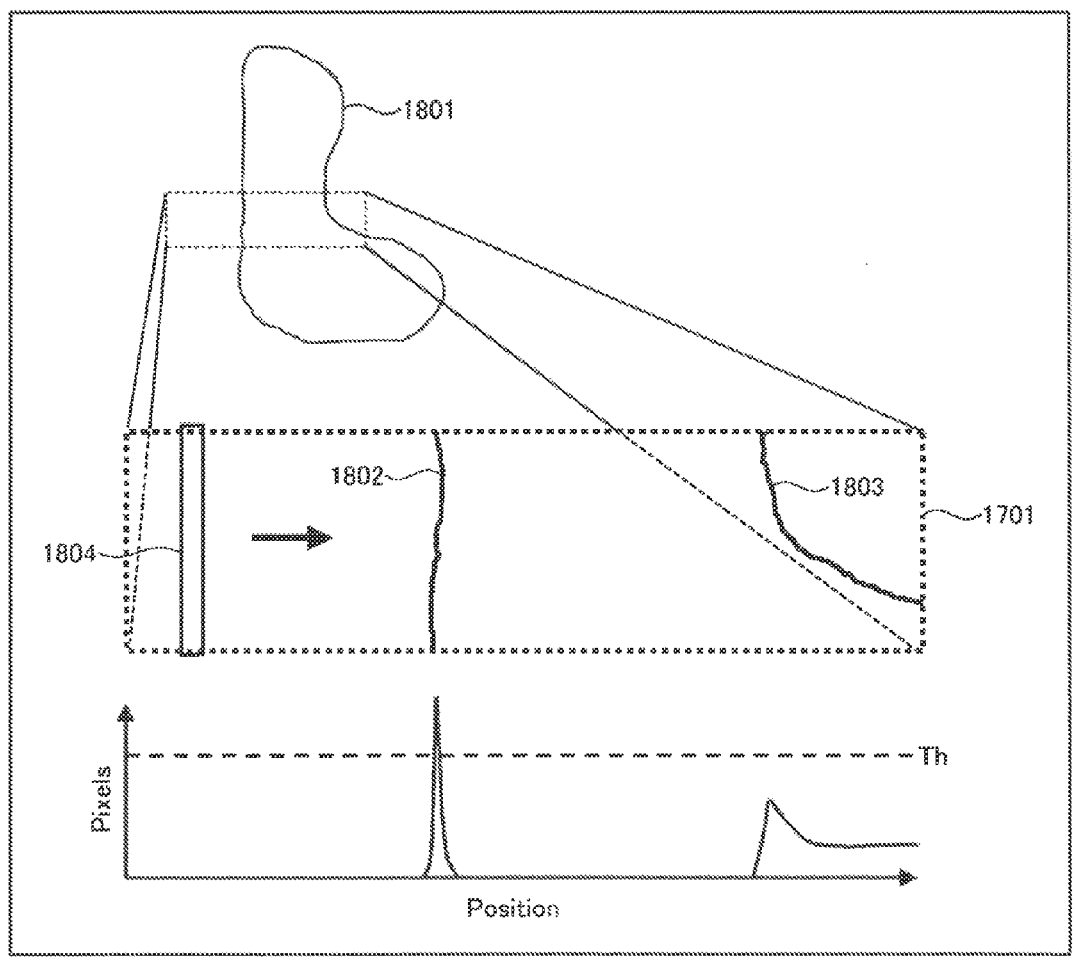
FIG. 18 is a diagram for illustrating a judgment method on the pattern information included within the measurement area.

In the present embodiment, first, it is judged whether or not the contour line and edge information included within the measurement area are suitable for the measurement to be targeted. FIG. 18 is a conceptual diagram for illustrating a judgment technique for judging whether or not the pattern information included within the measurement area is suitable therefor. The measurement area 1701 includes two edges (i.e., left-side edge 1802 and right-side edge 1803) of the contour line 1801. In the present embodiment, the measurement to be targeted is the measurement on the line-width in the X direction. Accordingly, both of the left-side edge 1802 and the right-side edge 1803 should be formed along the Y direction. If, however, the measurement area is shifted, it turns out that an oblique line-segment, like the right-side edge 1803, is included within the measurement area. In the present embodiment, in order to judge the situation like this, an evaluation window 1804 for counting the number of predetermined-condition-equipped pixels included within the measurement area is displaced along the X direction. This evaluation window's displacement operation makes it possible to judge the direction of the pattern within the measurement area.

Concretely the image processing unit 207 monitors a change in the number of pixels that are detected with respect to the position in the X direction. Subsequently, the edge of a portion whose pixel number has exceeded a predetermined pixel number is judged as a properly-formed edge. Meanwhile, a portion whose pixel number is smaller than the predetermined pixel number is judged as a no-edge-equipped portion, or a not-properly-formed edge. In the case of the present embodiment, if the measurement area is positioned at the proper position, two peaks should appear which have exceeded the predetermined pixel number. If the number of the peaks that have exceeded the predetermined pixel number is larger than two, the image processing unit issues a message to the effect that the measurement area is not set at the proper position, or a signal for making the automated correction.

According to the configuration as described above, it becomes possible to perform the verification of the recipe easily. The error message is made displayable on a display device set up on the input device 219, or on another device's display device. This display of the error message allows the operator to make the recipe correction immediately with the input device 219 or the like.

Also, the measurement-area judgment method as described above is only an example after all. Namely, whatever image processing method is applicable, as long as it is capable of judging whether or not the pattern included within the measurement area is of the desired shape. For example, the following judgment technique is conceivable: Namely, the template used for the measurement area 1701 is prepared. Moreover, if the coincidence degree is higher than or equal to a predetermined coincidence degree, it is judged that the measurement area is set at the proper position. Meanwhile, if the coincidence degree is lower than the predetermined coincidence degree, it is judged that the measurement area is set at an incorrect position.

Figure 19:
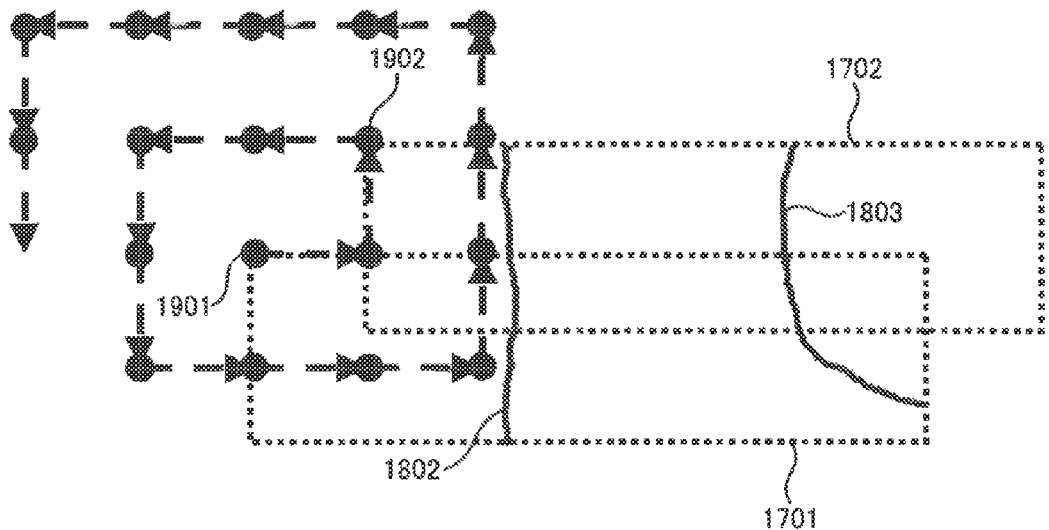
FIG. 19 is a diagram for illustrating search steps for the measurement area.
Figure 20:
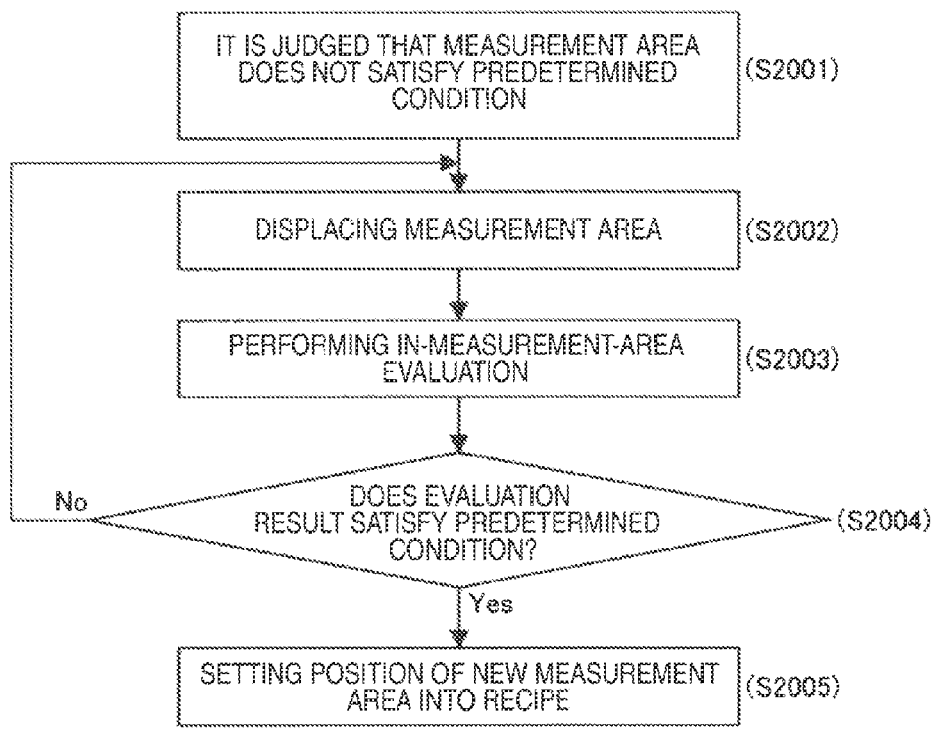
FIG. 20 is a flowchart for illustrating the search steps for the measurement area.

Next, the explanation will be given below concerning the following technique: Namely, if it is judged that a desired measurement location is not included within the measurement area, the position of the measurement area is automatically corrected. FIG. 19 is a diagram for illustrating search steps through which the proper measurement area 1702 is searched for by shifting the measurement area little by little. FIG. 20 is a flowchart for illustrating the search steps. At an initial setting position 1901 of the measurement area 1701, the evaluation within the measurement area is performed as is exemplified in FIG. 18. Then, if it is judged that the measurement area does not satisfy a predetermined condition (step S2001), the image processing unit 207 displaces the measurement, area into the arrow's direction (step S2002). Moreover, at this displacement destination, the unit 207 performs the in-measurement-area evaluation similarly (step S2003). In the case of the present embodiment, the measurement area is displaced in a vortex-like manner, then performing the in-measurement-area evaluation at each displacement destination. Furthermore, it is judged whether or not the measurement area satisfies the predetermined condition (step S2004). Then, if the measurement area satisfies the predetermined condition, the image processing unit 207 terminates the displacement, then registering the position of the predetermined-condition-satisfying measurement area into the recipe (step S2005). FIG. 19 illustrates the following example: Namely, the recipe registration is performed assuming that the evaluation result satisfies the predetermined condition at the second-point displacement point 1902.

According to the judgment technique as described above, it becomes possible to perform the recipe-verification-based recipe's resetting automatically.

Incidentally, the recipe's correction can be made automatically, or can be made based on the operator's judgment. Also, the operator can issue an instruction by displaying the situation illustrated in FIG. 17 (i.e., superimposition-display image of the composite image and the measurement area) on the screen of the present device.

Also, with respect to the dimension-measurement area that becomes valid as a result of this correction, the dimension measurement on the pseudo image is made rising a dimension-measurement algorithm such as the threshold-value method installed in the dimension-measurement device. Moreover, the dimension-measurement result is outputted in accordance with the output format of the dimension-measurement device.

In the present embodiment explained so far, the explanation has been given regarding the example that relates to the emulator of the measurement recipe, and that evaluates the validity of the measurement recipe. The present embodiment, however, can also be used for the verification of accuracy of the transfer simulation. This verification is performed by creating the pseudo image on the basis of the transfer simulation. Namely, the accuracy of the transfer simulation can be verified as follows: Namely, a difference value between the present-device-measured dimension-measurement value and the design data, or a difference value between the edge position of the pseudo image's contour line and the design data is reflected onto the simulation-used model data. This method allows the verification of the accuracy of the transfer simulation.

Embodiment 4

Figure 8:
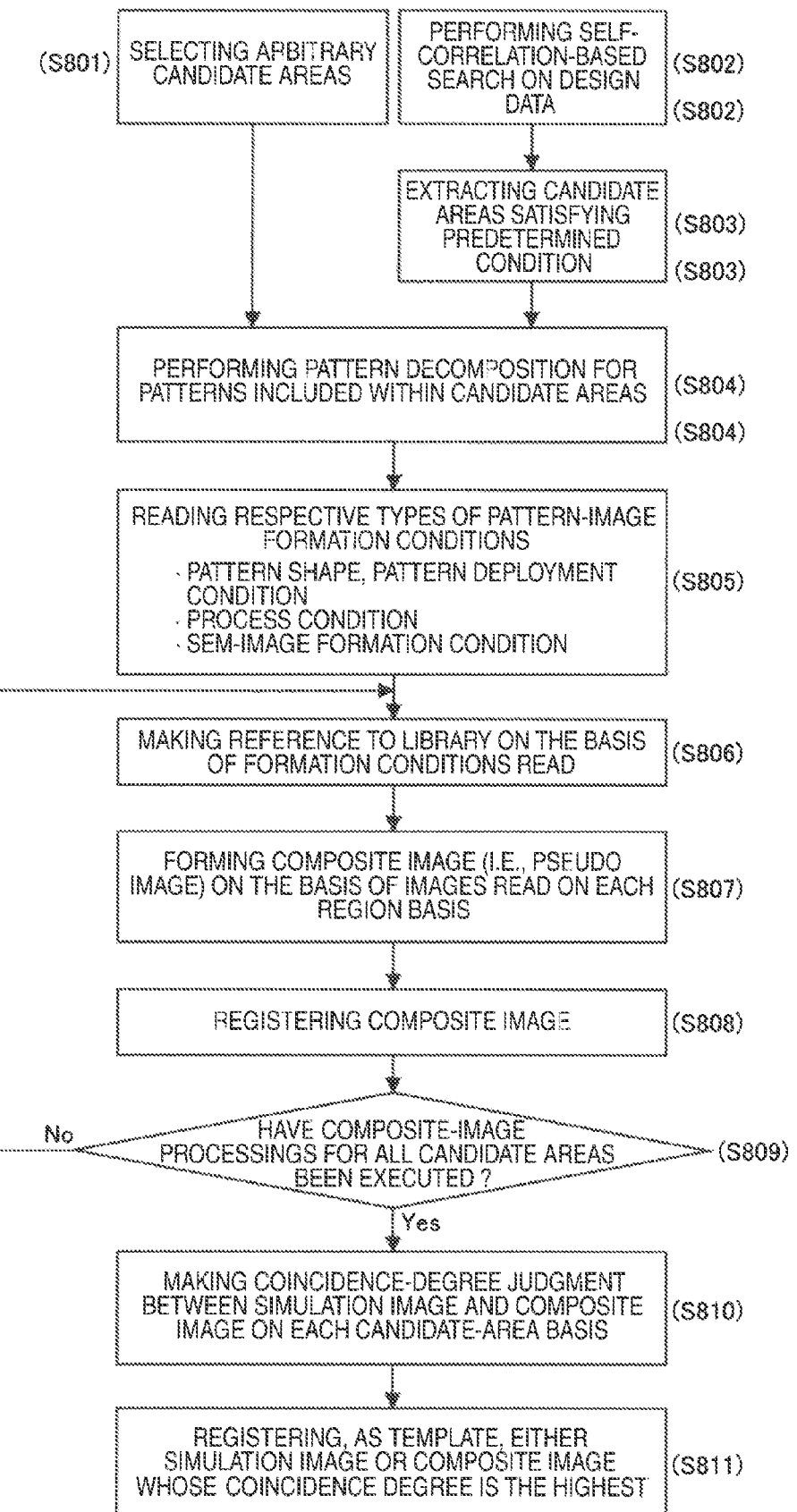
FIG. 8 is a flowchart for illustrating steps through which the template-matching-used template image is selected based on the comparison between the simulation image and the composite image.

In the embodiments explained so far, the explanation has been given concerning the device or the like for performing the template creation and recipe emulation mainly. In the following explanation, however, the explanation will be given regarding a device or the like which is capable of performing the verification and selection of a single template candidate, or a plurality of template candidates on the design data. FIG. 8 is a flowchart for illustrating the steps. First, arbitrary template-candidate areas are selected on the design data, or the simulation image (step S801). Otherwise, the template-candidate positions are automatically selected on the design data (step S802).

The selection of the template-candidate positions is made using the input device 219 or the like. Also, the automated selection is made by a pattern-candidate selection unit 216. For example, a plurality of target candidates are selected based on a self-correlation processing, and with respect to a plurality of positions surrounding the measurement area of the design data. A plurality of locations whose self-correlation values are high exist within a to-be-searched area of the template matching. This situation means that there is a high possibility that the position alignment is performed at a position other than the desired matching position. Accordingly, the matching-position candidates are selected in such a manner that this area is excluded. Also, at a step S803, candidate areas that satisfy a predetermined condition are extracted from among the matching-position candidates extracted at the step S802. These candidate areas extracted are further narrowed by making the judgment as to whether or not a unique pattern suitable for the matching exists (e.g., both of the X-direction line-segment and the Y-direction line-segment are included) within the candidate areas. Incidentally, when narrowing the candidate areas automatically, another image-processing algorithm tor selecting the matching-suitable unique pattern shape is also applicable.

The patterns are decomposed which are included within the single template candidate or plurality of template-position candidates selected as described above (step S804). Moreover, as is the case with the steps S104 to S107 in FIG. 1, the composite image is formed (steps S805 to S808). This processing is performed with respect to the plurality of candidates. Furthermore, a pattern-candidate judgment unit 217 registers, as a final template, either a simulation image or a composite image whose coincidence degree is the highest from among the simulation images and the composite images (steps S810 and 811).

The template is formed by way of the processing steps described so far. This template-forming scheme makes it possible to create the template that is close to the SEM image, using the already-existing registered images, and without causing the SEM to operate.

The above-described description has been given in accompaniment with the embodiments. It is apparent for those who are skilled in the art, however, that the present invention is not limited thereto, and that a variety of modifications and amendments can be made within the spirit of the present invention and the scope of the appended claims.

REFERENCE SIGNS LIST

201 SEM's main body
202 scan deflector
203 detector
204 control device
205 calculation processing device
206 recipe execution unit
207 Image processing unit
208 memory
209 matching processing unit
210 template creation unit
211 emulation unit
218 design-data storage medium
219 input device
220 simulator

The invention claimed is:

1. An image processing device, comprising:
an image processing unit configured to set an operation condition of a charged-particle beam device based on design data on a semiconductor element, wherein said image processing unit comprises a composite-image formation unit configured to:
access a library for storing charged-particle beam device operation condition information, pattern types and pattern information for a plurality of pattern elements, and
form a composite image of a pattern, having a plurality of pattern regions, using said pattern information to form each pattern-region and based on said charged-particle beam device operation condition information and selection of a pattern type from said pattern types.

2. The image processing device according to claim 1, wherein
said pattern information includes image data, and
said image processing unit forms said composite image from said image data stored in said library.

3. The image processing device according to claim 1, wherein
said pattern information are pattern edge's luminance distribution information, and pattern and background portion's luminance information, and
said image processing unit applying an image processing to graphics data on the basis of said luminance distribution information and said luminance information, said graphics data being obtained based on said design data.

4. The image processing device according to claim 1, wherein
said image processing unit comprises a matching processing unit for executing a template matching between said composite image and graphics data, said graphics data being formed based on said design data.

5. The image processing device according to claim 4, wherein
said image processing unit is configured to judge whether or not a pattern is included within a measurement area, said measurement area being registered together with said graphics data, said pattern becoming a measurement target of said composite image, said measurement target being a wafer or mask-reticle pattern.

6. The image processing device according to claim 5, wherein
if said image processing unit judges that said pattern is not included within said measurement area, said image processing unit searches for an area within which said pattern is included, said pattern becoming said measurement target.

7. The image processing device according to claim 4, wherein
said image processing unit creates image data that is created by superimposing a measurement area and said composite image on each other.

8. The image processing device according to claim 1, wherein
said image processing unit registers said composite image into a storage medium as a template-matching-used template.

9. The image processing device according to claim 1, wherein
said image processing device comprises a matching processing unit for executing a pattern matching in which said composite image is used as its template.

10. The image processing device according to claim 1, wherein
said image processing unit executes a template matching in such a manner that said composite image is used as a to-be-searched image for said template matching.

11. A computer program product for causing a computer to execute a template matching on an image, using a template formed based on design data, wherein said program causes said computer to:
access a library for storing charged-particle beam device operation condition information, pattern types and pattern information for a plurality of pattern elements, and
form a composite image of a pattern, having a plurality of pattern regions, using said pattern information to form each pattern-region, and based on said charged-particle beam device operation condition information and selection of a pattern type from said pattern types.

12. The computer program product according to claim 11, wherein
said pattern information includes image data,
said program causing said computer to form said composite image from said image data stored in said library.

13. The computer program product according to claim 11, wherein
said pattern information are pattern edge's luminance distribution information, and pattern and background portion's luminance information, and
said program causing said computer to apply an image processing to graphics data on the basis of said luminance distribution information and said luminance information, said graphics data being obtained based on said design data.

14. The computer program product according to claim 11, wherein
said program causes said computer to execute a template matching between said composite image and graphics data, said graphics data being formed based on said design data.

15. The computer program product according to claim 14, wherein
said program causes said computer to judge whether or not a pattern is included within a measurement area, said measurement area being registered together with said graphics data, said pattern becoming measurement target of said composite image, said measurement target being a wafer or mask-reticle pattern.

* * * * *